US005461189A

United States Patent [19]

Higashi et al.

[11] Patent Number: 5,461,189

[45] Date of Patent: Oct. 24, 1995

[54] WAVEGUIDE ELECTRONIC MUSICAL INSTRUMENT EMPLOYING PRE-PERFORMANCE TUNING

[75] Inventors: Iwao Higashi; Mitsuru Fukui; Toshifumi Kunimoto, all of Hamamatsu, Japan

[73] Assignee: Yamaha Corporation, Japan

[21] Appl. No.: 267,842

[22] Filed: Jun. 28, 1994

Related U.S. Application Data

[63] Continuation of Ser. No. 28,722, Mar. 9, 1993, which is a continuation of Ser. No. 725,294, Jul. 3, 1991, abandoned.

[30] Foreign Application Priority Data

| | | | |
|---|---|---|---|
| Jul. 6, 1990 | [JP] | Japan | 2-179048 |
| Oct. 2, 1990 | [JP] | Japan | 2-264504 |
| Oct. 18, 1990 | [JP] | Japan | 2-280101 |

[51] Int. Cl.[6] .......... H03G 3/00

[52] U.S. Cl. .......... 84/601; 84/622

[58] Field of Search .......... 84/DIG. 26, 601, 84/604–607, 622–629

[56] References Cited

U.S. PATENT DOCUMENTS

| | | | |
|---|---|---|---|
| 4,392,405 | 7/1983 | Franz et al. | 84/DIG. 4 |
| 4,484,506 | 11/1984 | Sato | 84/601 |
| 4,558,624 | 12/1985 | Tomisawa et al. | 84/626 |
| 4,922,795 | 5/1990 | Suzuki | 84/624 |
| 4,984,276 | 1/1991 | Smith | 381/63 |
| 5,014,586 | 5/1991 | Sakashita | 84/637 |

FOREIGN PATENT DOCUMENTS

| | | |
|---|---|---|
| 0248527 | 4/1987 | European Pat. Off. . |
| 52-30417 | 3/1977 | Japan . |
| 58-58679 | 12/1983 | Japan . |
| 63-40199 | 2/1988 | Japan . |

*Primary Examiner*—William M. Shoop, Jr.
*Assistant Examiner*—Brian Sircus
*Attorney, Agent, or Firm*—Graham & James

[57] ABSTRACT

Electronic musical instrument comprises a musical tone synthesis device, a memory and pitch control device. The musical tone synthesis device processes input signals based on at least one parameter, and synthesizes and outputs musical tones with pitches in accordance with the values of the parameters. The memory stores initial values of the parameters which generate a musical tone having a target pitch. The pitch control device detects a difference between the target pitch of the musical tone and a pitch of the musical tone outputted form the musical tone synthesis device. And, the pitch control device outputs a value of the parameter which will eliminate the difference to the musical tone synthesis device.

19 Claims, 16 Drawing Sheets

WAVEGUIDE ELECTRONIC MUSICAL INSTRUMENT EMPLOYING PRE-PERFORMANCE TUNING

This is a continuation of application Ser. No. 08/028,722, filed on Mar. 9, 1993, which is a file wrapper continuation application of Ser. No. 07/725,294, filed Jul. 3, 1991, now abandoned.

BACKGROUND OF THE INVENTION

1. Field of the Invention

The present invention relates to an electronic musical instrument which is ideal for use in the synthesis of acoustic musical instruments such as wind instruments or string instruments.

2. Prior Art

Electronic musical instruments have been conventionally known which electronically synthesize the musical tones generated by acoustic musical instruments such as wind instruments or string instruments. This type of electronic musical instrument has some sort of tone source for the synthesis of musical tones. In this tone source, an apparatus is known in which a memory is used in which waveform signals which form the bases of musical tones are stored in advance, and at the time of tone generation, various types of processing are conducted on a waveform signal which is read out from the memory and a musical tone is generated, and an apparatus is known in which the musical tones of an acoustic musical instrument are synthesized by means of the simulation of the tone generation mechanism of an acoustic musical instrument by means of an electronic circuit.

In particular, the tone source which simulates a tone generation mechanism, which will be discussed hereinafter, has a closed loop circuit comprising delay circuits, filters, non-linear circuits and the like. By means of this tone source, a musical tone which is somewhat close to the tone of an acoustic musical instrument can be synthesized by means of the adjustment of musical tone synthesis parameters, for example the delay length of delay circuits. This type of technology is disclosed in, for example, Japanese Patent Application, First Publication, Laid open number Sho. 63-40199, and in Japanese Patent Application, Second Publication number Sho. 58-58679.

In the above described conventional electronic musical instruments, the pitch of the musical tone is determined by the total amount of the delay of the delay circuits. However, in actuality, as a result of other parameters such as filter characteristics and the like, the transmission speed is as high as that of a high frequency signal, for example, and so the transmission speed varies in accordance with the pitch of the tone which is to be synthesized. Accordingly, when the delay length of the delay circuit is set univocally, there is a problem in that the musical tone having a desired pitch can not be achieved.

Furthermore, in conventional electronic musical instruments, when a performer manipulates the various parameters (delay length of the delay circuit or filter characteristics or the like ) of the musical tone synthesis circuit in order to set the tone color and the like of the musical tones, fluctuations are generated in the pitch of the musical tones for the above given reasons. Accordingly, there has been a problem in that in the case of the performance of a performer who is unable to conduct accurate pitch control, or in the case of the use of a keyboard musical instrument or the like having controls which can not control pitch, the pitch is inaccurate.

SUMMARY OF THE INVENTION

The present invention was created in view of the above conditions; it has as an object thereof to provide an electronic musical instrument which is capable of synthesizing in real time musical tones having accurate pitch.

In order to solve the above problems, in the invention stated in claim 1, in an electronic musical instrument which conducts fixed processing with respect to an input signal based on at least one parameter, synthesizes a musical tone having a pitch corresponding to the value of this parameter, and outputs this musical tone, a pitch control mechanism which detects the difference between the target pitch of a musical tone to be created and the pitch of a musical tone outputted by the musical tone synthesis mechanism, finds a value of a parameter which will eliminate this difference, and outputs this value to the musical tone synthesis mechanism, is provided.

In the invention stated in claim 2, in the electronic musical instrument stated in claim 1, a memory mechanism which stores an initial value of a parameter which is to create a musical tone having a target pitch, and a control mechanism which replaces the initial value with parameter values which are found by means of the pitch control mechanism are provided; and the musical tone synthesis means synthesizes a musical tone with a pitch corresponding to the parameter value stored in the memory means and outputs this musical tone.

In in the electronic musical instrument as further stated in claim 1, the musical tone synthesis mechanism is a loop-form signal path which conducts processing with respect to input signals based on at least one parameter, and by means of the cycling of the input signals around the loop, musical tones having a pitch corresponding to the parameter values are synthesized and outputted.

In accordance with the invention stated in claim 1, the pitch control mechanism detects the difference between the target pitch of the musical tone which is to be generated by means of the signal paths of the musical tone synthesis mechanism and the pitch of the musical tone actually outputted by the musical tone synthesis mechanism, and finds a parameter value of the musical tone synthesis mechanism which will eliminate this difference. In the musical tone synthesis mechanism, a musical tone is synthesized in accordance with a parameter value which is found by means of the pitch control mechanism.

In accordance with the invention stated in claim 2, in the musical tone synthesis mechanism, initial values of parameters of musical tones having target pitches which are to be generated are stored in a memory mechanism. The control mechanism replaces the above mentioned initial values of the memory mechanism with parameter values which are found by the pitch control mechanism. In the musical tone synthesis mechanism, musical tones are synthesized in accordance with the parameter values stored in the memory mechanism.

In accordance with the invention stated in claim 3, parameter values which are found by means of the pitch control mechanism are supplied to a musical tone synthesis mechanism possessed by the loop-form signal path, and by means of the musical tone synthesis mechanism, musical tones having pitches corresponding to the above mentioned parameter values are synthesized and generated.

As explained above, in accordance with the present invention an effect is achieved of being able to generate, in real time, a musical tone having accurate pitch.

DETAILED DESCRIPTION OF THE PREFERRED EMBODIMENTS

In the following, the preferred embodiments of the present invention will be explained with reference to the diagrams.

(First Preferred Embodiment)

Figure 1:
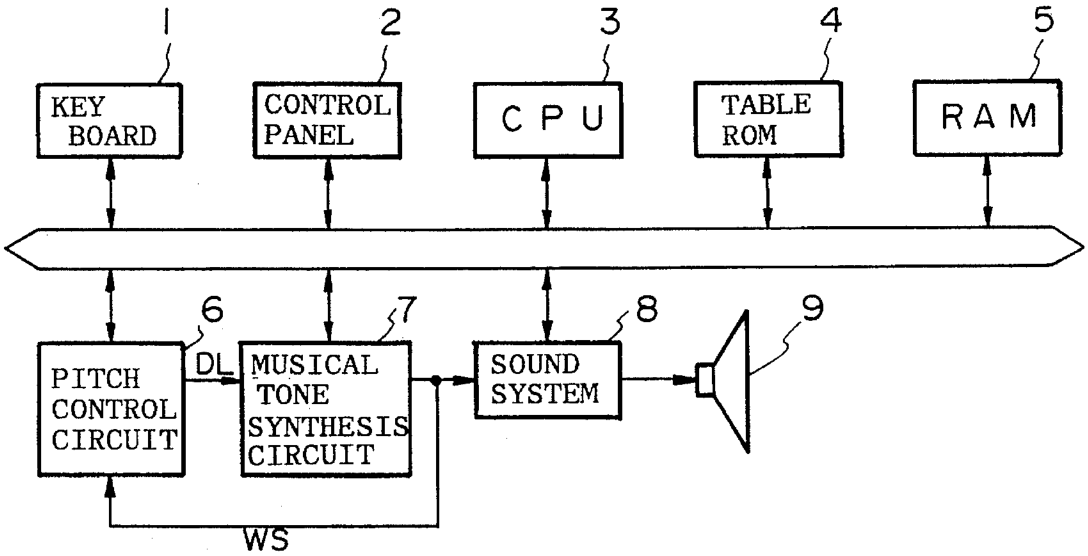
FIG. 1 is a block diagram showing the structure of the first preferred embodiment of the present invention.

FIG. 1 is a block diagram showing the structure of a first preferred embodiment of the present invention. In the diagram, reference numeral 1 indicates a keyboard comprising black and white keys. Reference numeral 2 indicates a control panel; it enables the setting of parameters relating to characteristics of the non-linear type circuits and of filters and the like located within a musical tone synthesis circuit, which is described hereinafter, and the tone color of the outputted musical tones changes based on these parameters. CPU (Central Processing Unit) 3 executes fixed programs and controls all parts of the electronic musical instrument. Delay lengths dl for the generation of musical tones with fixed pitches are stored in table form in table ROM4 for all key codes KC and with respect to differing types of scales (temperament scale, just intonation scale, Pythagorean scale and the like). These scales are selectively set by means of control panel 2. Furthermore, delay length dl represents, approximately, initial values of the delay length (one parameter which determines the pitch of musical tones) in the delay feedback circuit, which will be discussed hereinafter. In addition, various data and the like are stored in RAM (random access memory) 5, and at the time of adjustment (tuning) of the pitch of each musical tone, the above described delay length dl tables are loaded. These delay lengths dl are replaced by newly determined delay lengths DL in processing by means of pitch adjustment, which is described hereinafter. Details thereof will be given in the explanation of the operation.

Figure 2:
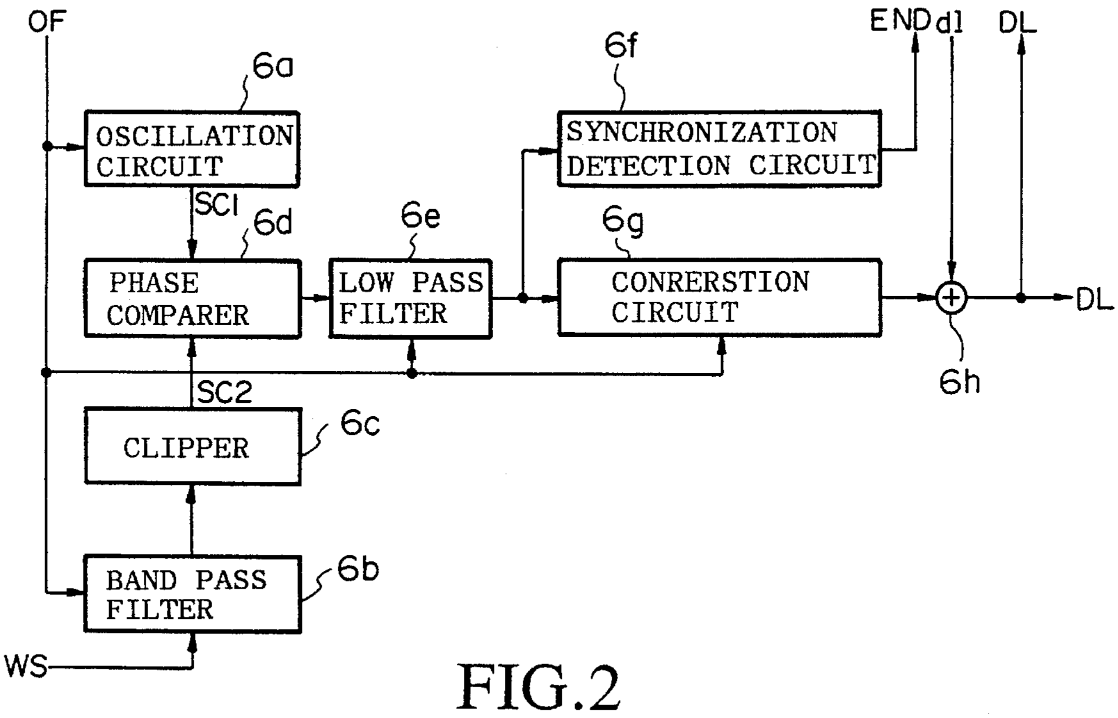
FIG. 2 is a block diagram showing the structure of the pitch control circuit of the same preferred embodiment.

A pitch control circuit 6 has been added in the invention of the present application. Pitch control circuit 6 incorporates data and the like relating to the pitch of musical tones which are to be generated which are supplied from CPU3 through the medium of a data bus, determines the above mentioned delay lengths DL, and supplies these to the musical tone synthesis circuit 7, which is described hereinafter. Next, an example of the structure of the pitch control circuit 6 will be explained with reference to the block diagram shown in FIG. 2. This pitch control circuit 6 is comprising oscillation circuit *6a*, band pass filter *6b*, clipper *6c*, phase comparer *6d*, low pass filter *6e*, synchronization detection circuit *6f*, conversion circuit *6g*, and adder *6h*. Oscillation circuit *6a* generates a rectangular wave SC1, which forms a standard of comparison, based on an oscillation signal OF having an oscillation frequency corresponding to a key code KC, and supplies this to phase comparer *6d*. Band pass filter *6b* restricts the band of a waveform signal WS which is synthesized by means of the music tone synthesis circuit 7 described hereinafter, and supplies this to clipper *6c*. Clipper *6c* reshapes waveform signal WS into the form of rectangular wave SC2, and supplies this signal to the phase comparer *6d* mentioned above. Phase comparer *6d* compares rectangular waves SC1 and SC2 and supplies the phase difference to low pass filter *6e*. Low pass filter *6e* first smooths the phase difference and then outputs this to synchronization circuit *6f* and conversion circuit *6g*. Synchronization detection circuit *6f* detects the phase difference, and in the case in which the phase difference lies within a fixed range, outputs a value "1" to the data bus as a END signal indicating that the pitch adjustment (tuning) corresponding to the musical tone in question is finished. Conversion circuit 6*g* comprises data tables or calculation circuits; it converts the above mentioned phase differences into values corresponding to delay length. These values are supplied to adder 6*h*. Adder 6*h* adds the values corresponding to phase differences and the delay lengths dl which were stored as initial values, calculates corrected delay lengths DL, and outputs these to musical tone synthesis circuit 7 and the data bus.

Figure 3:
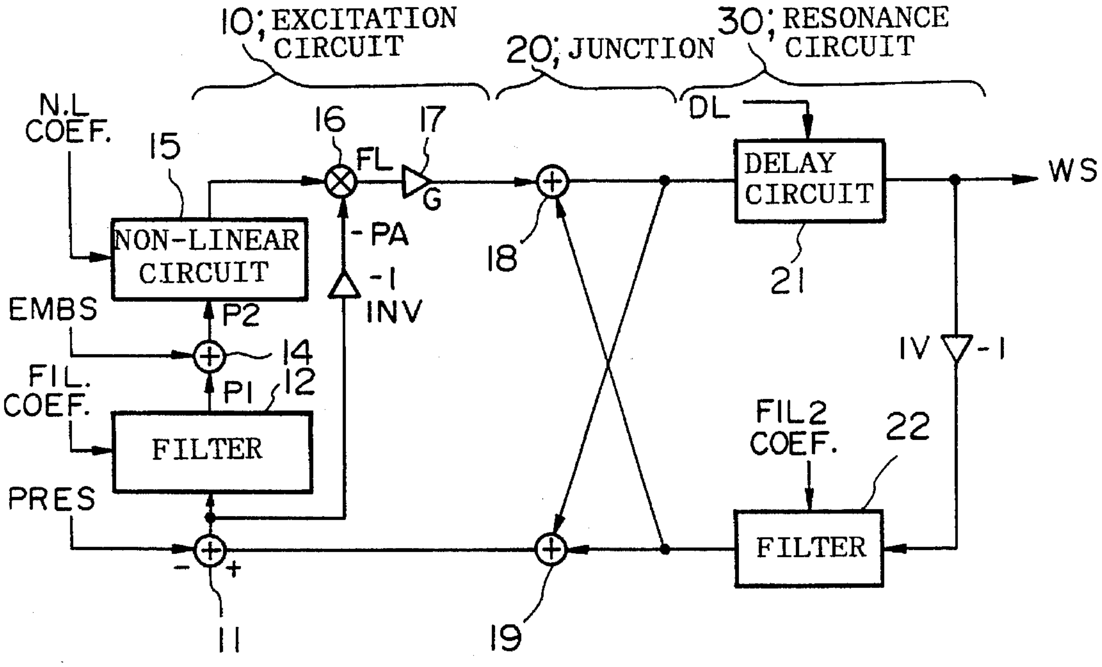
FIG. 3 is a block diagram showing the structure of the musical tone synthesis circuit of the same preferred embodiment.

Musical tone synthesis circuit 7 comprises a closed-loop circuit which simulates a wind instrument such as a clarinet or the like. Here, an example of the structure of musical tone synthesis circuit 7 will be explained with reference to the block diagram shown in FIG. 3. In this diagram, musical tone synthesis circuit 7 is comprising excitation circuit 10, which simulates the mouthpiece part of the wind instrument, resonance circuit 30, which simulates the resonance tube of the wind instrument, and junction 20, which simulates the scattering of the air pressure waves in the connecting part of the mouthpiece and the resonance tube. Excitation circuit 10 is comprising subtracter 11, filter 12, adder 14, non-linear type circuit 15, and multipliers 16, 17, and INV. A signal which is inputted from resonance circuit 30 through the medium of junction 20 and a playing pressure signal PRES corresponding to the playing pressure are supplied to subtracter 11. This subtracter 11 calculates a signal corresponding to the air pressure placed on the reed and outputs the signal to multiplier 16 through the medium of filter 12 and multiplier INV. Filter 12 comprises a linear low pass filter, and is inserted so that the amplitude of the signal which cycles between excitation circuit 10 and resonance circuit 30 does not become remarkably large at specified frequencies. The output signal P1 of filter 12 is supplied to adder 14. Adder 14 adds an embouchure EMBS corresponding to the shutting or the posture of the lips to output signal P1 of filter 12, and determines a signal P2 corresponding to the pressure which is placed on a reed in actuality. A non-linear type circuit 15 comprises a non-linear function table or calculation circuits. In the case in which it comprises calculation circuits, a non-linear coefficient N.L.COEF. for conducting fixed calculations is supplied through the medium of the data bus. Furthermore, in the case in which the non-linear type circuit comprises a non-linear function table, a value is stored which corresponds to the cross-sectional area of a gap between the reed and the mouthpiece part, or in other words, corresponds to the admittance with respect to air flow. This non-linear type circuit 15 is referred to by means of the above mentioned signal P2, and outputs a value corresponding to the above mentioned admittance as a signal Y. Multiplier 16 multiplies signal Y and a signal -PA which is supplied to the medium of multiplier INV, and obtains a signal FL corresponding to the flow speed of the air passing through the gap between the reed and the mouthpiece part. Multiplier 17 multiplies signal FL by a multiplication coefficient G. This multiplication coefficient G is a constant determined in accordance with the tube diameter in the origin of the attachment part of the mouthpiece part in the resonance tube, and corresponds to the difficulty of air passage, or in other words, corresponds to the impedance with respect to air flow. Multiplier 17 obtains a signal corresponding to the air pressure change generated at the entrance of the mouthpiece side of the resonance tube.

In junction 20, the output signal of resonance circuit 30 and the output signal of excitation circuit 10 are added by means of adder 18, and are supplied to resonance circuit 30, and furthermore, the output signal of adder 18 and the output signal of resonance circuit 30 are added by means of adder 19 and are supplied to excitation circuit 10.

Resonance circuit 30 is comprising delay circuit 21, filter 22 and multiplier IV. In order to simulate the delay from the generation of an air pressure wave (travelling wave) by the reed until this wave reaches a tone horn (holes which determine the intervals in a wind musical instrument), delay circuit 21 delays the output signal of junction 20 in accordance with a delay length DL which is supplied through the medium of pitch control circuit 6 or the data bus, and then supplies this signal to multiplier IV. In order to simulate the reflection of sound waves from the end of the resonance tube, multiplier IV multiplies the output signal of resonance circuit 30 by a value of "–1" and outputs this to filter 22. Filter 22 conducts band restriction on the output signal of multiplier IV, and then outputs this to junction 20.

In a musical tone synthesis circuit 7 having this type of structure, the excitation signal (hereinafter termed waveform signal WS) cycles between excitation circuit 10 and resonance circuit 30 through the medium of junction 20. In the case of this example, this waveform signal WS is extracted from the output of delay signal 21 and is supplied to the sound system 8 shown in FIG. 1. Sound system 8 conducts processing for the tone generation of waveform signal WS as a musical tone by means of speaker 9.

Figure 4:
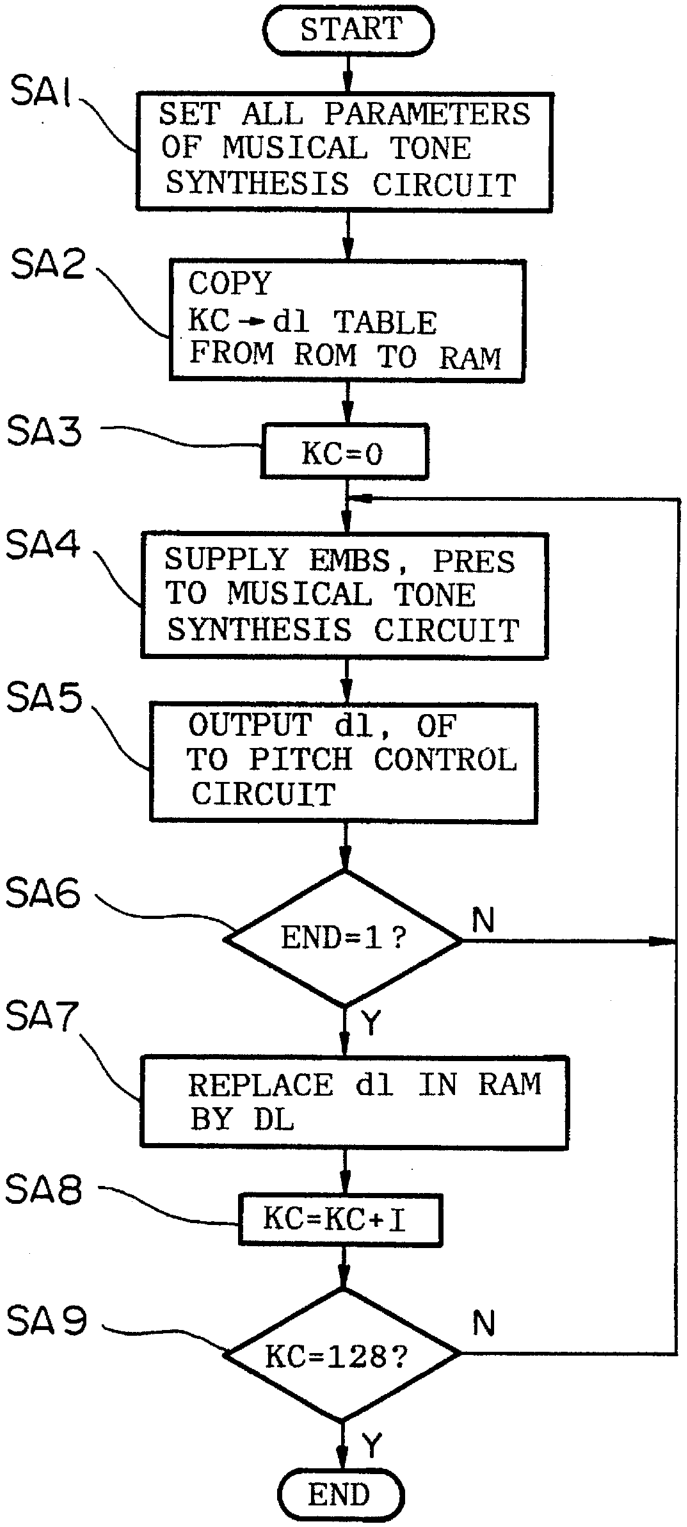
FIG. 4 is a flowchart for the purpose of explaining the operation of the same preferred embodiment.

Next, the operation of the above mentioned structure will be explained with reference to the flowchart shown in FIG. 4. When the power is turned on or the user changes the parameters, CPU3 executes the flowchart shown in FIG. 4 in order to adjust (tune) the pitch of the musical tones corresponding to all keys of keyboard 1. First, in step SA1, the initial period setting of all parameters of the musical tone synthesis circuit 7 is conducted. Among these parameters, there are for example, the nonlinear coefficient N.L.COEF., which is set by the user, filter coefficients FIL.COEF., FIL2.COEF., and the like. Next, step SA2 is proceeded to, a delay length dl table corresponding to each key code KC stored in ROM4 is read out and copied into RAMS. Next, in step SA3, the value of key code KC is set to "0" (a key code KC corresponding to the first key). In steps SA4, embouchure EMBS and playing pressure signal PRES are outputted to musical tone synthesis circuit 7. By means of this, the operational preparations of musical tone synthesis circuit 7 are conducted. Next, in step SA5, the delay length dl corresponding to the key code KC (=0) which was copied into RAM5, and an oscillation signal OF corresponding to the frequency of the key code KC are outputted to pitch control circuit 6.

The musical tone synthesis circuit 7 sets the delay length dl into delay circuit 21 and synthesizes waveform signal WS. On the other hand, pitch control circuit 6 detects the phase difference between the waveform signal WS outputted by musical tone synthesis circuit 7 and oscillation signal OF, and by means of conversion circuit 6*g*, converts this phase difference into a value relating to delay length data, and outputs this to adder 6*h*. Adder 6*h* adds the value corresponding to the above phase difference and the delay length dl which was used as an initial value, and finds a corrected delay length DL. For example, in the case of encoding having a phase difference between waveform signal WS and oscillation signal OF, the delay length dl is corrected in a positive direction, and delay length DL becomes large, while in the case in which the encoding of the above phase difference is inverted, delay length dl is corrected in a negative direction, and delay length DL becomes small. This delay length DL is outputted to musical tone synthesis circuit 7 and to the data bus. This delay length DL is established as the a mount of delay of delay circuit 21 in musical tone synthesis circuit 7. Accordingly, in musical tone synthesis circuit 7, a waveform signal WS having a pitch corresponding to the above amount of delay is created. This waveform signal WS is fed back to pitch control circuit 6.

Next, in step SA6, a determination is made as to whether the value of the END signal outputted by synchronization detection circuit **6*f* of pitch control circuit 6 is "1" or not. Here, furthermore, if the phase difference of the above new waveform signal WS and the oscillation signal OF is not within a fixed range, the value of the END signal outputted by the synchronization detection circuit 6*f* does not acquire a value of "1". Accordingly, the determination result of step SA6 is "NO", and step SA4 is returned to. Steps SA4, SA5, and SA6 are repeatedly executed until the results of the determination in step SA6** are "YES".

As a result, pitch control circuit 6 uses the waveform signal WS fed back from the above musical tone synthesis circuit 7 as a new signal and finds the phase difference between oscillation signal OF and this signal, finds a new delay length DL corresponding to this phase difference, and musical tone synthesis circuit 7 creates a waveform signal WS with a pitch which is corrected based on the new delay length DL. Then, this waveform signal WS is supplied to pitch control circuit 6, and in pitch control circuit 6, a corrected delay length DL is found. In this manner, the pitch of the musical tone generated in musical tone synthesis circuit 7 is gradually adjusted.

When the phase difference of oscillation signal OF and waveform signal WS enters the fixed range, the synchronization detection circuit **6*f* sets the value of the END signal to "1". When the value of the END signal becomes "1", the results of the judgement in step SA6 become "YES", and step SA7 is proceeded to. In step SA7, the delay length dl corresponding to the key code KC (=0) within RAM5 is replaced by the delay length DL, the adjustment of which has been completed. Then, the step SA8 is proceeded to, and key code KC is incremented. Next, in step SA9, a determination is made as to whether the key KC has reached the value of "128" or not. This is a step which determines whether all 127 tones have been adjusted or not. In this case, as the value of key KC is "2", the result of the determination of step SA9 is "NO" and step SA4 is returned to Steps SA4–SA9 are repeatedly executed and the adjustment corresponding to all keys is conducted until the result of the determination of step SA9** becomes "YES".

On the other hand, when the pitch adjustment corresponding to all keys has been completed, and key code KC has acquired a value of "128", the results of the determination of step SA9 become "YES", and the flowchart is completed.

By means of the completion of the above processing, each delay length dl which is copied into RAM5 is replaced by a delay length DL which is adjusted so as to produce a waveform signal WS with a fixed pitch.

Furthermore, after the tuning of all keys has been completed, in the case in which normal performing is conducted, if the value of the oscillation signal OF which is supplied to pitch control circuit 6 is set to "0", the value of the output of conversion circuit **6*g* will become "0", and the delay values dl corresponding to the key codes KC stored in RAM5 will be outputted in an unchanged manner. These delay lengths dl can be replaced by delay lengths DL (final values) at the completion of pitch adjustment, so that musical tones having accurate pitch are produced in sound system 8 and speaker 9**.

(Second Preferred Embodiment)

Figure 5:
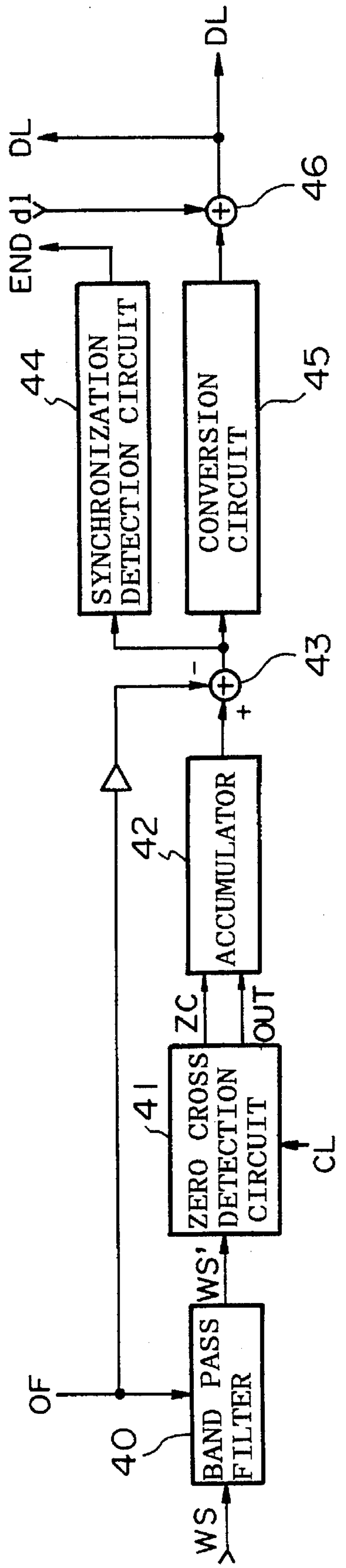
FIG. 5 is a block diagram showing the structure of a pitch control circuit in accordance with a second preferred embodiment of the present invention.
Figure 6:
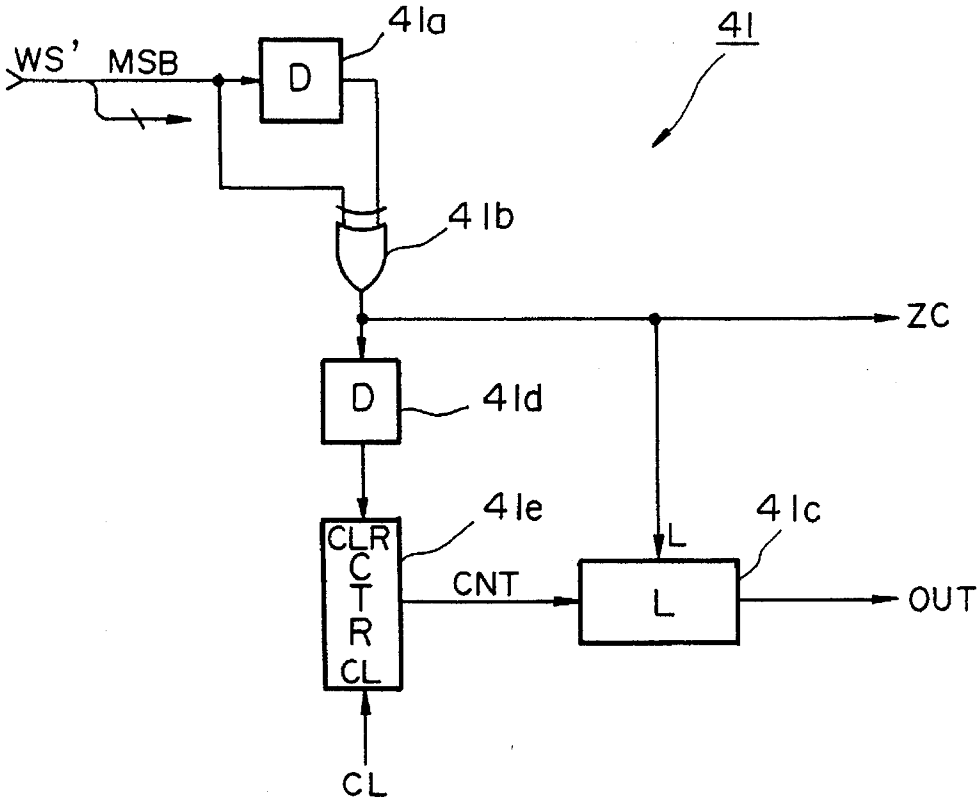
FIG. 6 is a block diagram showing the structure of a zero cross detection circuit in accordance with the same second preferred embodiment.

Next, a second preferred embodiment of the present invention will be explained with reference to FIGS. 5–7. In accordance with the special features of this preferred embodiment, the structure of the pitch control circuit shown in FIG. 1 is altered, the pitch of the waveform signal WS is measured, and the delay length is corrected in accordance with this pitch. FIG. 5 is a block diagram showing the structure, in accordance with a second preferred embodiment, of the pitch control circuit 6 shown in FIG. 1. In the diagram, reference number 40 indicates a band pass filter, which alters an interruption frequency in correspondence with an oscillation signal OF having a frequency of a musical tone which is to be generated and thus filters waveform signal WS. This is because the zero cross points stated hereinafter may be excessively detected when a high frequency is superimposed on waveform signal WS, and furthermore, there is a possibility that no zero cross point will be detected when a low frequency is superimposed. The filtered signal is supplied as waveform signal WS' to zero cross detection circuit 41.

Zero cross detection circuit 41 detects zero cross points by means of the detection of the state of the most significant bit MSB of waveform signal WS', and outputs a detection signal ZC to accumulator 42, and in addition, counts the clock signals CL from one zero cross point to the next zero cross point, and outputs this count number as output signal OUT to accumulator 42. The details of the structure of this zero cross detection circuit 41 are given below.

Accumulator 42 counts the detection signals ZC, accumulates the count numbers OUT of a 16 zero cross area (an 8-cycle area in terms of waveform), and outputs this to subtracter 43. The count numbers OUT are accumulated in order to smooth out the irregularities of each one cycle waveform signal WS'.

Next, subtracter 43 subtracts the oscillation signal OF corresponding to the frequency of the key code KC supplied through the medium of the multiplier from the accumulated count number, and finds the frequency displacement of the waveform signal WS' with respect to the oscillation signal OF. Data relating to this displacement are supplied to synchronization detection circuit 44 and conversion circuit 45. Synchronization detection circuit 44 detects the output data of subtracter 43, and in the case in which the displacement is within a fixed range, supplies a value of "1" to the data bus as an END signal indicating that the tuning of the musical tone has been completed. Conversion circuit 45 converts the above displacement into a parameter relating to the delay length data. This parameter is supplied to adder 46. Adder 46 adds the parameter and a delay length dl which was stored in advance as an initial value, and outputs a corrected delay length DL. This delay length DL is outputted to musical tone synthesis circuit 7 and the data bus.

Next, an example of the structure of the above zero cross detection circuit 41 will be explained with reference to the block diagram shown in FIG. 6. In the diagram, a delay circuit **41*a* delays the most significant bit MSB (encoding bit) of waveform signal WS' by a fixed period (corresponding to one data part) and supplies this to one input terminal of exclusive OR circuit 41*b*. The most significant bit MSB of waveform signal WS' is supplied to the other input terminal of exclusive OR circuit 41*b*** without time delay.

Exclusive OR circuit 41*b* determines the exclusive OR of the most significant bit MSB of waveform signal WS' and the most significant bit MSB of the previous data, and outputs the result. That is, the output of the exclusive OR circuit 41*d* indicates whether the above most significant bit MSB is inverted or not. In other words, the output of exclusive OR circuit 41*b* indicates whether the zero cross point is one at which the waveform signal WS' is changing from a positive to a negative value or from a negative to a positive value. The output signal of this exclusive OR circuit 41*b* is supplied to accumulator 42 as detection signal ZC, and is supplied to latch circuit 41*c* as latch signal L. Furthermore, the above detection signal ZC is supplied to the reset terminal CLR of CTR (counter) 41*e* after being delayed once through the medium of delay circuit 41*d*. CTR 41*e* counts clock signals CL from the time when a detection signal ZC is supplied until the next detection signal ZC is supplied, and outputs this count number CNT to latch circuit 41*c*. Latch circuit 41*c* latches the count number CNT at the point in time when the detection signal ZC is supplied as a latch signal, and outputs an output signal OUT to accumulator 42.

Figure 7:
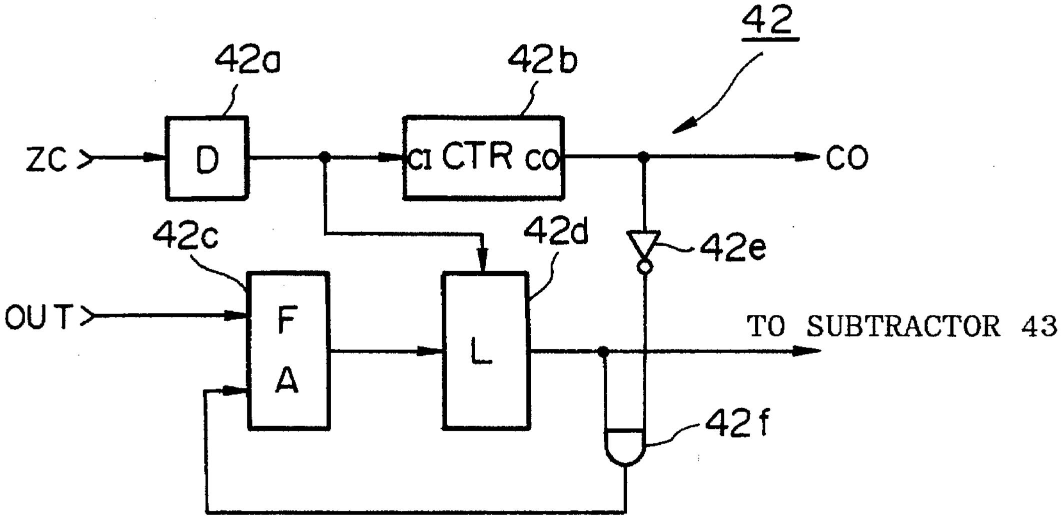
FIG. 7 is a block diagram showing the structure of an accumulator in accordance with the same second preferred embodiment.

Next, an example of the above accumulator 42 will be explained with reference to the block diagram which is shown in FIG. 7. In this diagram, a delay circuit 42*a* delays a detection signal ZC by a fixed delay length, and then outputs this signal to CTR 42*b*, and outputs this signal to a latch circuit 42*d*, described hereinafter, as a latch signal. CTR 42*b* is a 16-stage counter; it counts the above signals ZC and sets the value of the output signal CO to "1" when an overflow occurs. That is, it counts detection signals ZC and sets the value of output signal CO to "1" after each seventeenth signal. This output signal CO is supplied to one input terminal of the AND circuit 42*e* through the medium of a NOT circuit 42*f*. AND circuit 42*e* inputs the data latched in latch circuit 42*d* (the calculation results of full adder 42*c* one time previously) only in the case in which value of output signal CO is "0". Full adder 42*c* adds count number OUT and the output data of the above AND 42*e*, and outputs the result of the calculation to latch circuit 42*d*. Latch circuit 42*d* latches the above calculation results at the time at which the above detection signal ZC is supplied and inputs these results into the other input terminal of the above AND circuit 42*f*, and outputs the results to subtracter 43 shown in FIG. 5. When the value of the output signal becomes "1", the data stored by full adder 42*c* and latch circuit 42*d* are cleared.

In accordance with the above constructions, waveform signal WS passes through a band pass filter 40 corresponding to the present musical tone pitch, and then, in zero cross detection circuit 41, zero cross points are detected, a detection signal ZC indicating a zero cross point is outputted, and a count is made between cross points based on the clock signal CL, and a count number OUT indicating the pitch of the waveform signal WS is outputted. Next, accumulator 42 counts detection signals ZC, and accumulates 16 count numbers OUT. By means of this, accumulator 42 determines the clock number between zero cross points, that is, the cycle of waveform signal WS.

After this, in subtracter 43, the frequency of oscillation signal OF (above, a value converted to an amount having the same dimensions as the accumulation result) is subtracted from the accumulation result of accumulator 42 corresponding to the cycle of the above waveform signal WS, and a value is calculated relating to the displacement from correct pitch. Then, synchronization detection circuit 44 detects the output data of subtracter 43, and in the case in which the displacement is within a fixed range, outputs a value of "1" as an END signal, indicating the completion of the tuning of the musical tone, to the data bus. Furthermore, conversion circuit 45 converts the above displacement into a parameter relating to delay length data. Adder 46 adds the value of this parameter and the delay length dl, which was previously stored as an initial value, and outputs a corrected delay length DL. Hereinafter, in this preferred embodiment, as in the preferred embodiment which functions by means of a phase comparison stated above, the delay lengths dl which were copied into RAM5 corresponding to all keys are replaced by corrected delay lengths DL.

As a result, in the case in which normal performance is conducted, if the oscillation signal OF which is supplied to pitch control circuit 6 is set to a value of "0", a delay length DL (final value) in which the adjustment of pitch has been completed is supplied to musical tone synthesis circuit 7, so that a waveform signal WS with accurate pitch is created, and this waveform signal WS is transformed into a tone in sound system 8 and speaker 9.

(Third Preferred Embodiment)

Next, a third preferred embodiment of the present invention will be explained with reference to FIG. 8. In this diagram, the parts which correspond to parts shown in the preferred embodiment of FIG. 1 have the same reference numerals, and an explanation thereof will be here omitted. In the diagram, manually operable member 50 consists of pitch bend wheel 50*a*. In the actual electronic musical instrument, this is provided on control panel 2 in the manner shown in FIG. 9. TUNE key 54, number panel 55, and the above pitch bend wheel 50*a* are provided on this control panel 2. Furthermore, RAM5 is used for the storing of correct delay data obtained by means of the tuning processing, as well as for a temporary storage area at the time of calculations by means of CPU3.

Figure 10:
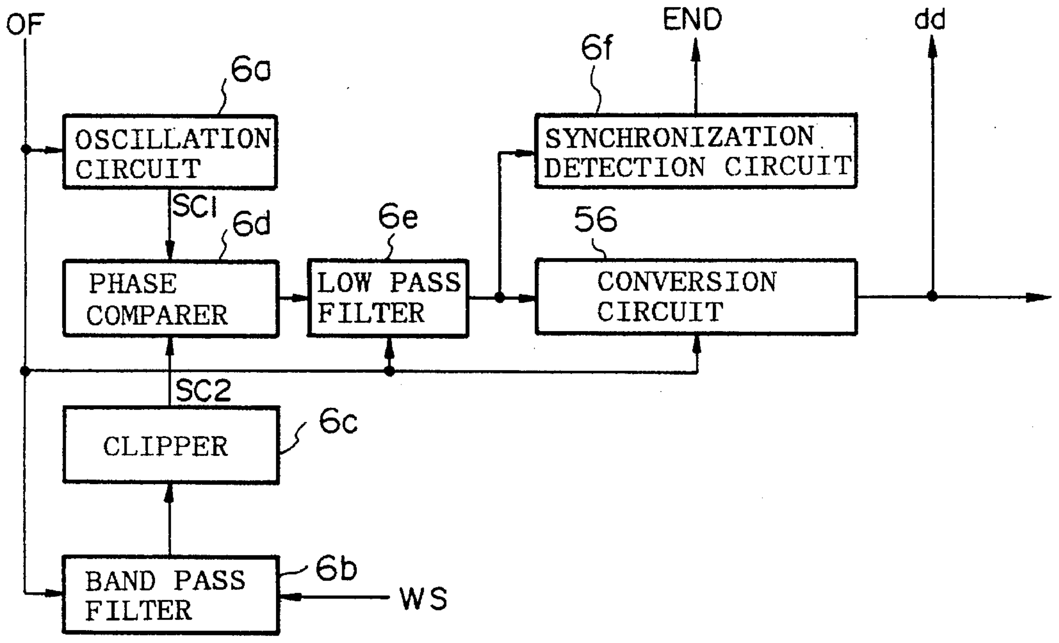
FIG. 10 is a block diagram showing the structure of a pitch control circuit in accordance with the same third preferred embodiment.

Reference number 52 indicates a pitch control circuit; the details of the construction thereof are shown in FIG. 10. This pitch control circuit 52 is based on oscillation signal OF and waveform signal WS, finds a correction amount dd corresponding to a delay length DL of a delay circuit of musical tone synthesis circuit 53 (details hereof will be given hereinafter), and supplies this to CPU3 through the data bus or supplies this directly to musical tone synthesis circuit 53.

Figure 11:
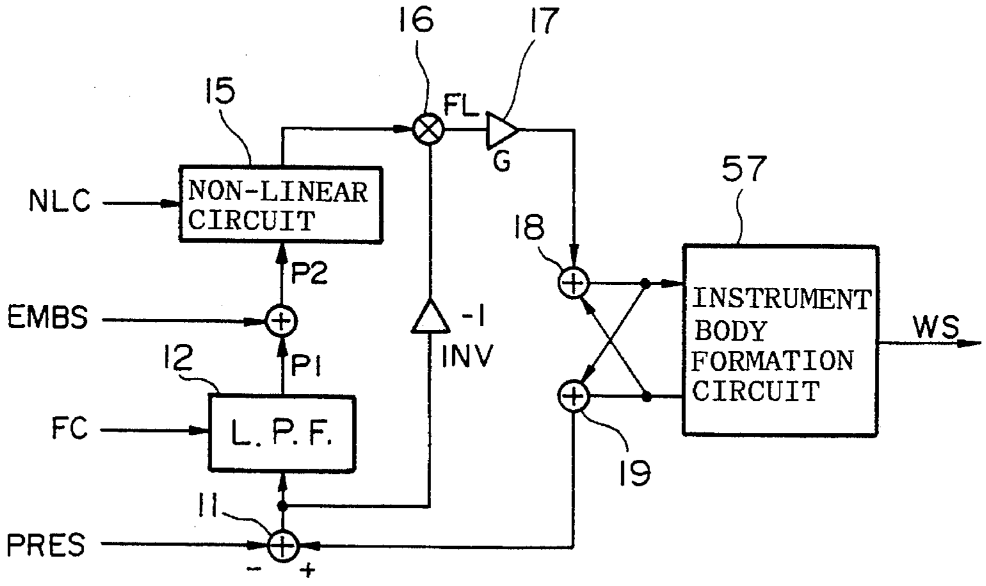
FIG. 11 is a block diagram showing the structure of a musical tone synthesis circuit in accordance with the same third preferred embodiment.
Figure 12:
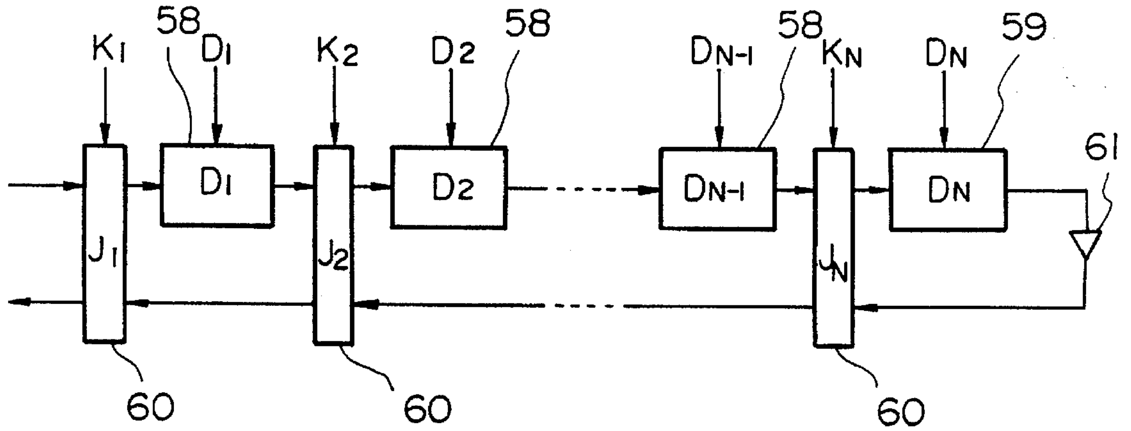
FIG. 12 is a block diagram showing the structure of a pipe-body formation circuit in accordance with the same third preferred embodiment.

Musical tone synthesis circuit 53 comprises, as in the case of the above preferred embodiments, a closed-loop circuit which simulates a woodwind musical instrument such as a clarinet or the like. Here, the musical tone synthesis circuit 53 will be explained with reference to the block diagram shown in FIG. 11. In this diagram, musical tone synthesis circuit 53 has basically the same structure as the above described musical tone synthesis circuit 7; however, in order to simulate the instrument body more realistically, an instrument body formation circuit 57 is provided which has a multistage structure consisting of junctions and delay circuits, Next, FIG. 12 shows a block diagram showing an example of the structure of instrument body formation circuit 57. In the diagram, instrument body formation circuit 57 is comprising delay circuits 58, 58, . . . and 59, which simulate the propagation delay of the air pressure waves in the resonance chamber, junctions 60, 60 . . . , which are placed between these delay circuits, and inverter 61, which simulates the reflection of the air pressure waves at the end part of the resonance chamber. The delay periods D1, D2, . . . Dn−1, and Dn, which will be described hereinafter, are supplied to the delay circuits 58, 58, . . . and 59. Furthermore, multiplication coefficients K1, K2, . . . Kn, which will be described hereinafter, are supplied to the above junctions 60, 60 . . . ; these junctions 60, 60 . . . simulate the scattering of the air pressure wave which is generated at places at which the diameter of the instrument body changes in the resonance chamber.

Figure 13:
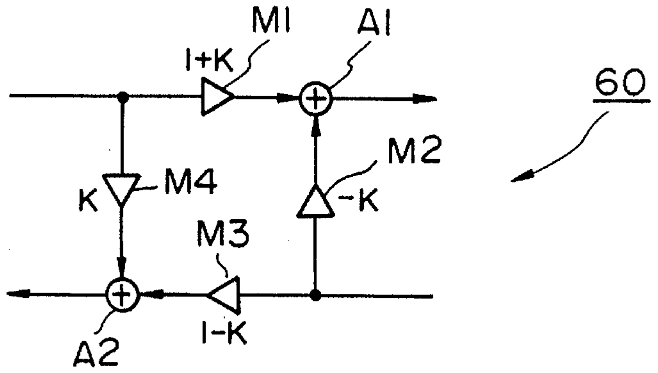
FIG. 13 is a block diagram showing the structure of a junction of the pipe-body formation circuit of the same third preferred embodiment.

Next, an example of this structure of a junction 60 is shown in the block diagram of FIG. 13. In this diagram, junction 60 comprises a 4-multiplication lattice comprising multipliers M1–M4 and adders A1 and A2. Here, the "1+K", "– K", "1–K" and "K", which are attached to the multipliers M1–M4, are multiplication coefficients; the value coefficient K is determined so that transmission characteristics are obtained which are similar to those of the actual resonance chamber.

Figure 14:
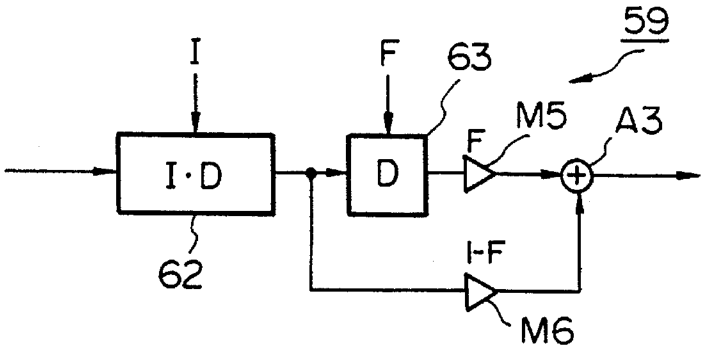
FIG. 14 is a block diagram showing the structure of a final step delay circuit in the same third preferred embodiment.

Next, the final stage delay circuit 57 shown in FIG. 12 will be explained with reference to FIG. 14. The final stage delay circuit 57 gives and receives fractional coefficients, and realizes, based on these coefficients, small delays. This is done for the purpose of obtaining, by means of the realization of smaller delays, the pitch accuracy which is necessary for the simulation with fidelity of the tones of a acoustic musical instrument. In FIG. 14, delay circuit 59 comprises a delay part 62, which uses an integer value I as a delay value, a delay part 63, which uses a fractional value F as a delay value, multipliers M5 and M6, and adder A3. The integer part of the delay period Dn is supplied to the above delay part 62, and the fractional part of the delay period Dn is supplied to delay part 63.

Figure 15:
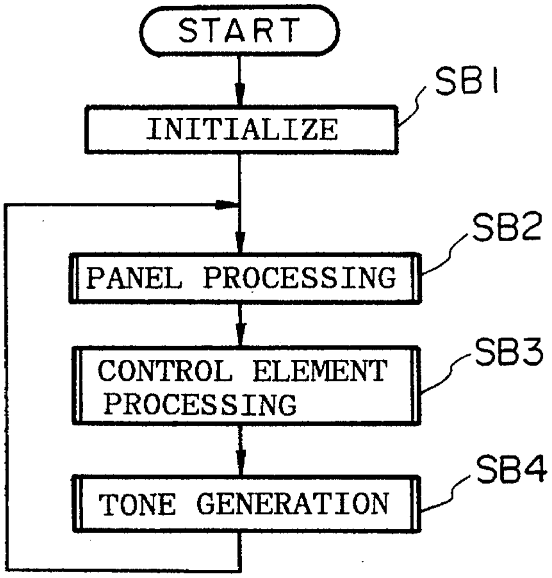
FIG. 15 is a main routine flowchart for the purpose of explaining the operation of the same third preferred embodiment.
Figure 16:
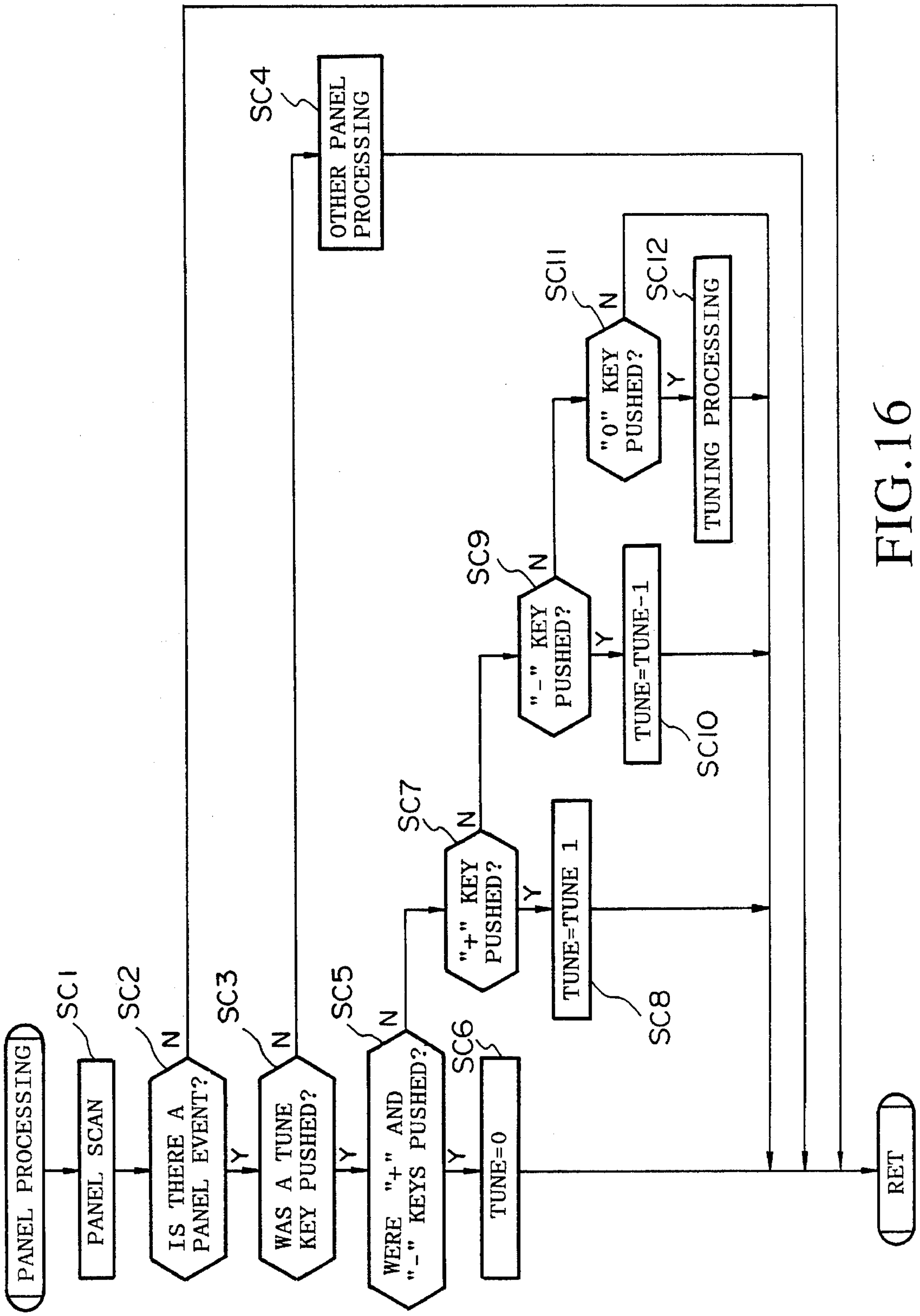
FIG. 16 is a flowchart for the purposes of explaining the operation of the panel processing in accordance with the third preferred embodiment.

Next, the operation of the above structure will be explained with reference to the flowchart shown in FIGS. 15 through 19. When the power is turned on, CPU3 executes the main routine shown in FIG. 15. First, in step SB1, the initialization of all registers and variables is carried out. Next, step SB2 is proceeded to, and the panel processing shown in FIG. 16 is carried out. In this panel processing, the alteration or the cancellation of the master tuning, and tuning processing, are carried out in correspondence with the controls of the control panel.

First, in step SC1, all keys of control panel 2 are scanned. Then, in step SC2, a determination is made as to whether a panel event has occurred or not; that is to say whether there has been some manipulation of the controls or not. Here, in the case in which the control panel was not manipulated, the results of the determination of step SC2 are (NO), the routine is completed, and the main routine shown in FIG. 15 is returned to.

On the other hand, in the case in which there has been some sort of panel event, the results of the determination of step SC2 are "YES", and step SC3 is proceeded to. In step SC3, a determination is made as to whether the panel event was at a TUNE key or not; that is to say, a determination is made as to whether a TUNE key was pressed or not. In the case in which the results of this determination of step SC3 are "NO", that is to say, in the case in which a TUNE key was not pressed, and a different panel event occurred, step SC4 is proceeded to. In step SC4, panel processing is conducted in accordance with the panel event. In the panel processing, processing is conducted which carries out the switching of tone color, or the editing of the parameters of said tone color. Then, when the processing of step SC4 is completed, the main routine of FIG. 15 is returned to.

On the other hand, in the case in which the results of the determination of step SC3 are "YES", that is to say, in the case in which there was a panel event resulting from the pressing of a TUNE key, step SC5 is proceeded to. In step SC5, a determination is made as to whether the "+" and "–" keys were simultaneously pressed or not. This is a step which makes a determination as to whether the alteration of the master tuning (the tuning state set by means of tuning described hereinafter) is cancelled or not. In the case in which the determination results of the step SC5 are "YES", that is to say, in the case in which the "+" and "–" keys were pressed at the same time as a TUNE key 54, and the cancellation of the master tuning alteration was thus indicated, step SC6 is proceeded to. In step CS6, after the register TUNE which is described hereinafter is set to a value of "0" (cancelled), the main routine of FIG. 15 is returned to.

On the other hand, in the case in which the results of the determination of the step SC5 are "NO", in other words, in the case in which the "+" and "–" keys were not simultaneously pressed, step SC7 is proceeded to. In this step SC7, a determination is made as to whether a "+" key was pressed or not. This is a step which determines whether the master tuning is raised or not. Here, if a "+" key was pressed (simultaneously with a TUNE key 54), the results of the determination in step SC7 are "YES" and step SC8 is proceeded to. In step SC8, after a value of "1" has been added to register TUNE (increment), the main routine of FIG. 15 is returned to. On the other hand, in the case in which the results of the determination of step SC7 are "NO", that is to say, in the case in which a "+" key was not pressed simultaneously, step SC9 is proceeded to. In step SC9, a determination is made as to whether a "–" key was pressed or not. This is a step which determines whether the master tuning is lowered or not. Here, if a "–" key was pressed (simultaneously with a TUNE key 54), the results of the determination in step SC9 become "YES", and step SC10 is proceeded to. In step SC10, after a value of "1" has been subtracted from register TUNE (decrement), the main routine of FIG. 15 is returned to.

On the other hand, in the case in which the results of the determination in step SC9, are "NO", that is to say, in the case in which a "–" key was not pressed, step SC11 is proceeded to. In step SC11, a determination is made as to whether a "0" key was pressed or not. This is a step which makes a determination as to whether the tuning processing which is a special feature of the present application is conducted or not. Here, if a "0" key was not pressed (simultaneously with a TUNE key), the results of the determination in step SC11 are "NO", and the main routine of FIG. 15 is returned to.

Figure 17:
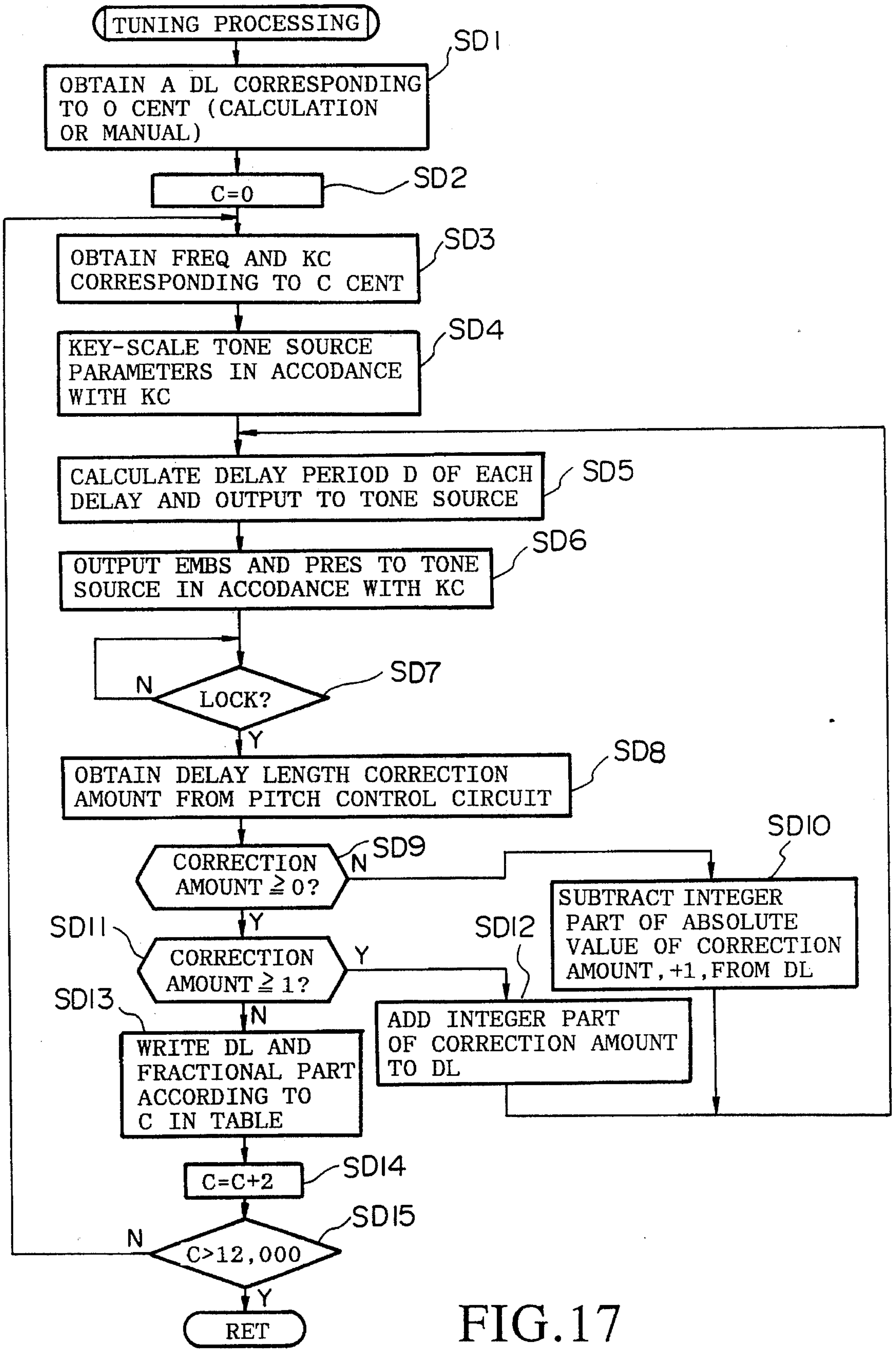
FIG. 17 is a flowchart for the purposes of explaining the operation of the tuning processing of the same third preferred embodiment.

On the other hand, if a "0" key was pressed simultaneously with a TUNE key 54, and the results of the determination of step SC11 are "YES", step SC12 is proceeded to. In step SC12, the tuning processing shown in FIG. 17 is executed. Next, the tuning processing in accordance with flowchart shown in FIG. 17 will be explained.

First, in step SD1, a delay length DL corresponding to 0 cents is obtained by means of calculation or manual manipulation. Next, step SD2 is proceeded to, and register C is set to a value of "0". This register C is a register which shows the cent value at the time of the conducting of tuning. Then, step SD3 is proceeded to, and a frequency FREQ and key code KC corresponding to the value of register C are obtained. Here, the reason that key code KC is necessary is as follows. When an attempt is made to store each parameter by key code KC, a large amount of memory area is necessary. In the present preferred embodiment, in order to save memory area, each parameter is set to a value which is the same as that of the time of normal musical tone synthesis.

However, it is difficult to insure pitch accuracy with parameters which are identical to those of the normal case. In the present preferred embodiment, the above parameters are subjected to scaling in accordance with the key codes KC. These key codes KC are obtained by means of calculations and reference to a table. Next, step SD4 is proceeded to, and the tone source parameters (filter coefficients, nonlinear forms, and the like) are subjected to key scaling in accordance with the above key codes KC. In the case in which the coefficients used in key scaling are not indicated in units of key codes KC, but rather in the smaller cent units, more accurate scaling can be conducted.

Next, step SD5 is proceeded to, the delay periods D1, D2, . . . , Dn of the delay circuit 58, 58, . . . , 59 shown in FIG. 12 are calculated from the delay length DL (in the case of this example, this is the total delay amount), and these are outputted to the delay circuits. The number of stages of the delay circuits 58, 58, . . . is determined by means of the form of the instrument body which is to be simulated and the number of divisions in the body which is to be simulated. Here, only the final step delay circuit 59 has a circuit structure which is capable of realizing delays corresponding to fractional coefficients, so that the delay period DN corresponding to this circuit is sent after correction by means of the correctional amount dd obtained by the pitch adjustment, which will be explained hereinafter.

Furthermore, in step SD6, the embouchure EMBS and pressure PRES corresponding to a key code KC are outputted to musical tone synthesis circuit 53. Musical tone synthesis circuit 53 actually generates waveform signals WS in accordance with the parameters which are sent thereto. In this way, in the present application, if a musical tone is not actually generated, it is impossible to know what pitch the musical tone will have. Next, step SD7 is proceeded to, and a determination is made as to whether the frequency of the waveform signal WS which is outputted by musical tone synthesis circuit 53 is locked to the frequency of the oscillation signal OF or not. This determination is conducted by means of the END signal which is outputted by pitch control circuit 52. The results of the determination of this step SD7 remain "NO" until the frequency of waveform signal WS is locked to the frequency of oscillation signal OF and pitch control circuit 52 outputs an END signal. Accordingly, this step is repeatedly executed until the result of the determination are "YES". Then, when the frequency of the waveform signal WS is locked to the frequency of the oscillation signal OF, the results of the determination of step SD7 become "YES", and step SD8 is proceeded to. In step SD8, the correction amount dd of the delay value outputted by pitch control circuit 52 is incorporated. Next, step SD9 is proceeded to, and a determination is made as to whether the correction amount dd is greater than "0" or not. Next, in the case in which this correction amount is less than "0", the results of a determination in step SD9 are "NO", and step SD10 is proceeded to. In step SD10, a value equal to the integer part I of the absolute value of correction amount dd, plus a value of 1, is subtracted from delay length DL. For example, if the correction amount DD is "–3.4", a value of "4" will be subtracted from delay value DL. By means of the subtraction, when the next lock operation is conducted, it is expected that only a positive fractional correction amount will be obtained. Next, step SD5 is returned to, and based on the delay value DL from which the correction amount dd has been subtracted, the delay periods D1,D2, . . . ,DN of the delay circuit 58,58,58 . . . . ,59 are calculated. After this, in the same manner as in the above processing, a new musical tone signal WS is created by means of the musical tone synthesis circuit 53 in steps SD6–SD8. Next, in step SD9, again, a determination is made as to whether the value of correctional amount dd is greater than "0" or not. In the case in which correction amount dd is smaller than "0", step SD10 is again proceeded to, a new delay value DL is calculated, and then steps SDS–SD9 are repeatedly executed.

On the other hand, in the case in which the correction amount dd is greater than "0", or when the correction value dd exceeds "0" by means of the processing according to the above steps SD5–SD10, the results of the determination of step SD9 become "YES", and step SD11 is proceeded to. In step SD11, a determination is made as to whether the correction amount dd is greater than "1" or not. Then, in the case in which the correction amount is greater then "1", the results of the determination of step SD11 are "YES", and step SD12 is proceeded to. In step SD12, the integer part I of correction amount dd is added to delay value DL. Then, step SD5 is returned to, and based on the delay value DL of the calculation result, the delay periods D1,D2, . . . DN of the delay circuits 58,58, . . . , 59 are calculated. Hereinafter, in the same manner as in the above processing, a new waveform signal WS is created in accordance with the waveform amount dd by means of musical tone synthesis circuit 53 in step SD6–SD8. Then, in step SD 11, again, a determination is made as whether the value of correction amount dd is greater then "1" or not. In the case in which the correction amount dd is greater than "1", step SD12 is proceeded to, a new delay value DL is obtained, and then steps SD5–SD9 are repeatedly executed.

Next, if the correction amount dd becomes smaller than "1", the results of the determination in step SD11 become "NO", and step SD13 is proceeded to. At this point, correction amount dd has been determined to be in a range of 1>dd>=0 by means of the determinations of steps SD9 and SD11. However, it may sometimes occur that correction value dd, as a result of the shape of the instrument body which is to be simulated or the behavior of the non-linear pattern, does not become less than one. This type of situation is unlikely to occur frequently; however as a means to counteract this, it is permissible to set the value of correction amount dd to a value higher than "2" in step SD11. Furthermore, it is also acceptable to compulsorily determine the value of correction amount dd after a certain number of cycles have passed (for example, three cycles), so as to avoid an infinite loop. Next, in step SD13, the delay value DL and the fractional part F of correction amount dd are written into a table in accordance with the cent value of register C. In the case of this example, only the fractional part F of the correction value dd is written, so that this contributes to the reduction of the data. Next, step SD14 is proceeded to, a value of "2" is added to register C, and the next cent value is proceeded to. Next, step SD15 is proceeded to. In this step SD15, a determination is made as to whether the value of register C has exceeded "12,000" or not. This is done so as to conduct tuning in the ten octave range from zero cents to 12,000 cents. Next, in the case in which the results of the determination in step SD15 are "NO", step SD3 is returned to, and after this, step SD3-SD14 are repeatedly executed.

On the other hand, when the value of register C exceeds "12,000", the results of the determination in step SD15 become "YES", the panel processing of FIG. 16 is returned to, and finally the main routine of FIG. 15 is returned to.

Figure 18:
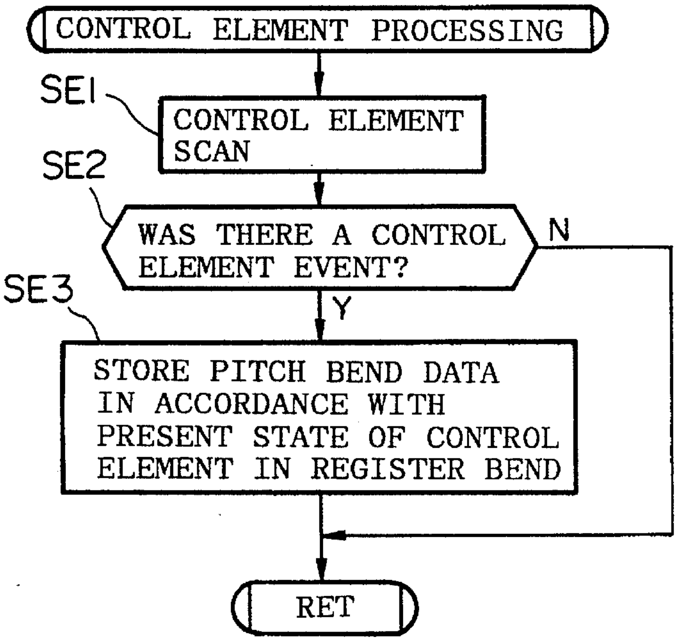
FIG. 18 is a flowchart for the purposes of explaining the operation of the control element processing of the same third preferred embodiment.

In this way, when the panel processing in step SB2 of the main routine is completed, step SB3 is proceeded to. In step SB3, the control processing shown in FIG. 18 is conducted.

First, CPU3 scans the pitch bend wheel 50*a* as a control element in step SC1. Generally, the operational state of pitch bend wheel 50*a* is obtained through the medium of an A/D (analog/digital) converter. Next, step SC2 is proceeded to, and based on the results of the above scan, a determination is made as to whether an event occurred at control element 50*a* or not. Here, in the case in which there was an event at control element 50*a*, the results of the determination in step SB2 are "YES", and step SC3 is proceeded to In step SC3, pitch bend data which have been converted to cent unit data in accordance with the present state of the control element are stored in register BEND.

Next, in the case in which the above step SC3 is completed, or the results of the determination in the above step SC2 are "NO", in other words, in the case in which no event occurred in the control element (pitch bend wheel), the main routine of FIG. 15 is returned to, and step SB4 is proceeded to.

Figure 19:
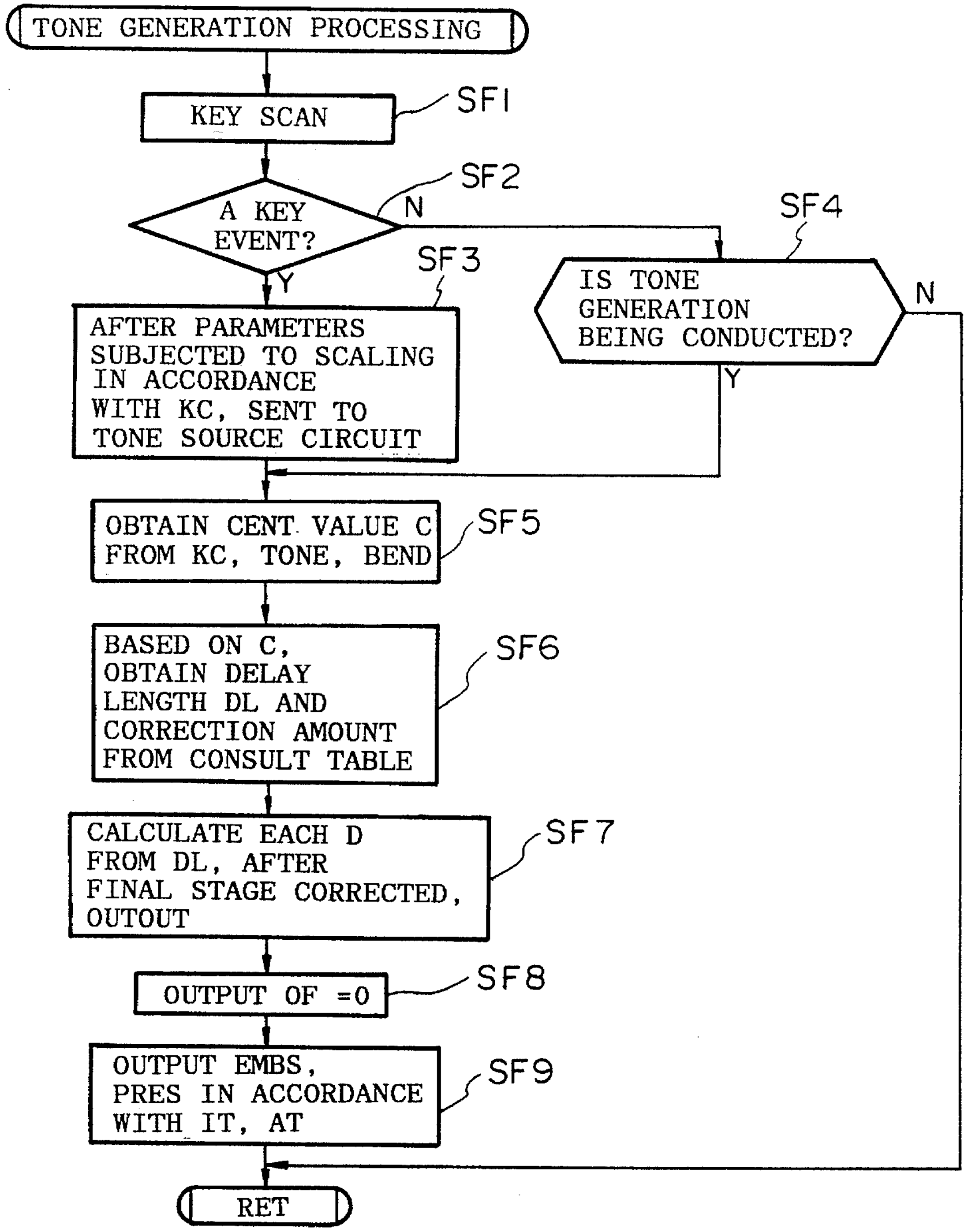
FIG. 19 is a flowchart for the purposes of explaining the operation of the tone generation processing of the same third preferred embodiment.

In step SB4, the tone generation processing shown in FIG. 19 is conducted. First, in step SF1, the keys of key board 1 are scanned. Next, in step SF2, a determination is made as to whether a key event was generated or not. Here, when there was a key event (a pressing of a key), the results of the determination of step SF2 are "YES", and step SF3 is proceeded to. In step SF3, the parameters are subjected to scaling in accordance with key code KC, and are outputted to musical tone synthesis circuit 53.

On the other hand, in the case in which the results of the determination in step SF2 are "NO", in other words, in the case in which there was no key event, step SF4 is proceeded to. In step SF4, a determination is made as to whether a tone is presently being generated or not. In the case in which the results of the determination of step SF4 are "NO", the routine is ended at this at this point and the main routine is returned to. On the other hand, in the case in which the results of the determination of step SF4 are "YES", various types of modulation may be added by means of control elements such as pitch bend wheel 50*a* or the like, so that step SF5 is proceeded to. Furthermore, in the case in which the above step SF3 is completed, step SF5 is proceeded to.

In step SF5, cent values are obtained in accordance with the data of key codes KC, register TUNE, and register BENT. In the above panel processing, if the master tuning is altered, the value of the above register TUNE will of course change value in accordance with the alteration. Furthermore, in the above control element processing, if the pitch bend wheel is operated, the value of the above register BENT will change to a value in accordance with this operation. In contrast to the assigning of values to register TUNE and register BENT in cent units, the units of the key codes KC are not cents, so that after a key code KC has been converted to cents by means of a mechanism such as reference to a table or calculations, a desired cent value C is obtained by means of adding the cent values of all data.

Next, step SF6 is proceeded to, and based on the above value C, a table is referred to, and the delay length DL and correction amount dd (fractional part F) which were written by means of the above tuning processing are read out. Next, step SF7 is proceeded to, and based on the delay length DL, the delay periods D1, D2, . . . , and the final stage delay period DN are found, the final stage delay period DN is corrected by means of correction amount dd, and outputted to musical tone synthesis circuit 53. Next, step SF8 is proceeded to, and so that pitch adjustment as a result of feedback does not become operative at the time of musical tone generation, the value of oscillation signal OF is set to "0", and this is outputted to pitch control circuit 52. Then, step SF9 is proceeded to. In step SF9, an embouchure EMBS and playing pressure signal PRES in accordance with the initial touch (IT) and after touch (AT) are outputted to musical tone synthesis circuit 53. Musical tone synthesis circuit 53 generates a waveform signal WS with accurate pitch based on the above embouchure EMBS, playing pressure signal PRES, and delay periods D1, D2, . . . , DN. Then, this waveform signal WS is generated as a musical tone in sound system 8 and speaker 9. Then, step SB2 is returned to, panel processing is conducted, and again, as in the case of the above processing, control element processing is conducted in step SB3, and tone generation processing is conducted successively in step SB4. Then, step SB2 is returned to, and the loop of step SB2–SB4 is again repeatedly executed.

(Fourth Preferred Embodiment)

Modification of the third preferred embodiment

In the following, a modification of the third preferred embodiment will be explained.

(Structure of the Fourth Preferred Embodiment)

Figure 8:
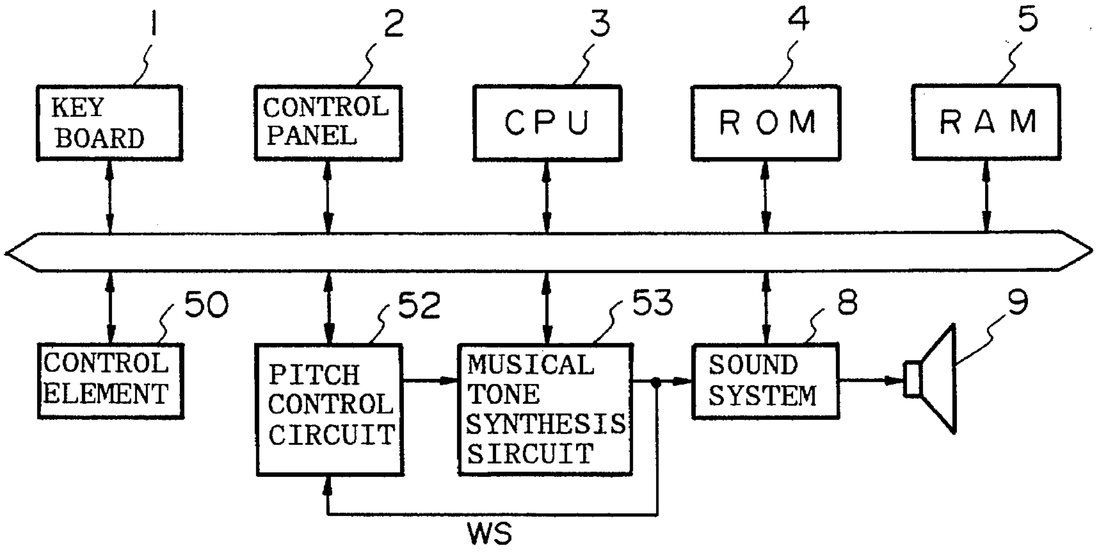
FIG. 8 is a block diagram showing the structure of a third preferred embodiment of the present invention.
Figure 9:
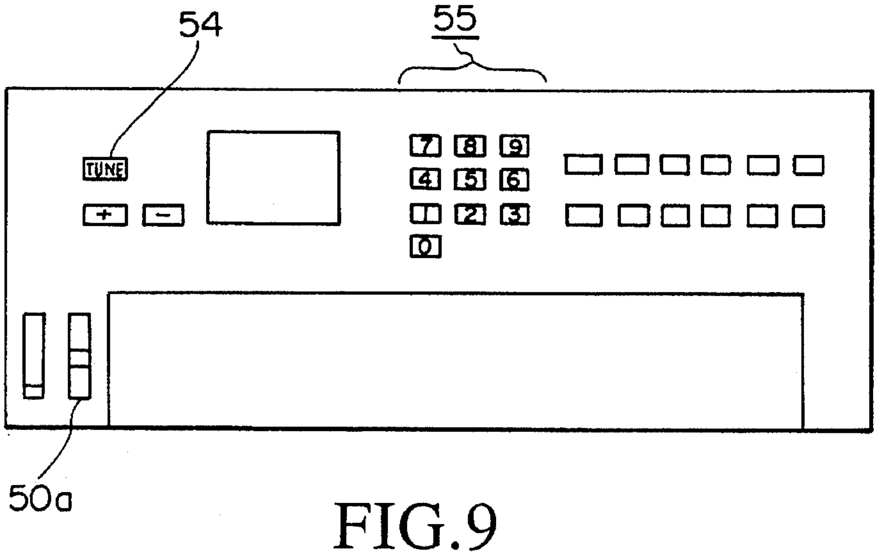
FIG. 9 is a front view showing the exterior of a control panel in accordance with the same third preferred embodiment.

The structure of the fourth preferred embodiment is identical to that of the third preferred embodiment shown in FIG. 8 above. Here, only the points of difference of the present preferred embodiment will be explained. In the present preferred embodiment, delay amounts corresponding to various combinations of embouchure EMBS and playing pressure signal PRES at the time of tuning are determined in advance as parameters, and are stored in table form in RAM5. Further more, at the time of performance, the embouchure EMBS and playing pressure signal PRES corresponding to the initial touch IT and the after touch AT are found, and a fixed delay amount is read out from the above RAM5 in accordance with these values. Accordingly, in the present preferred embodiment, the tuning processing at the time of tuning and the tone generation processing at the time of tone generation are different than those in the above third preferred embodiment.

(Operation of the Preferred Embodiment)

Figure 20:
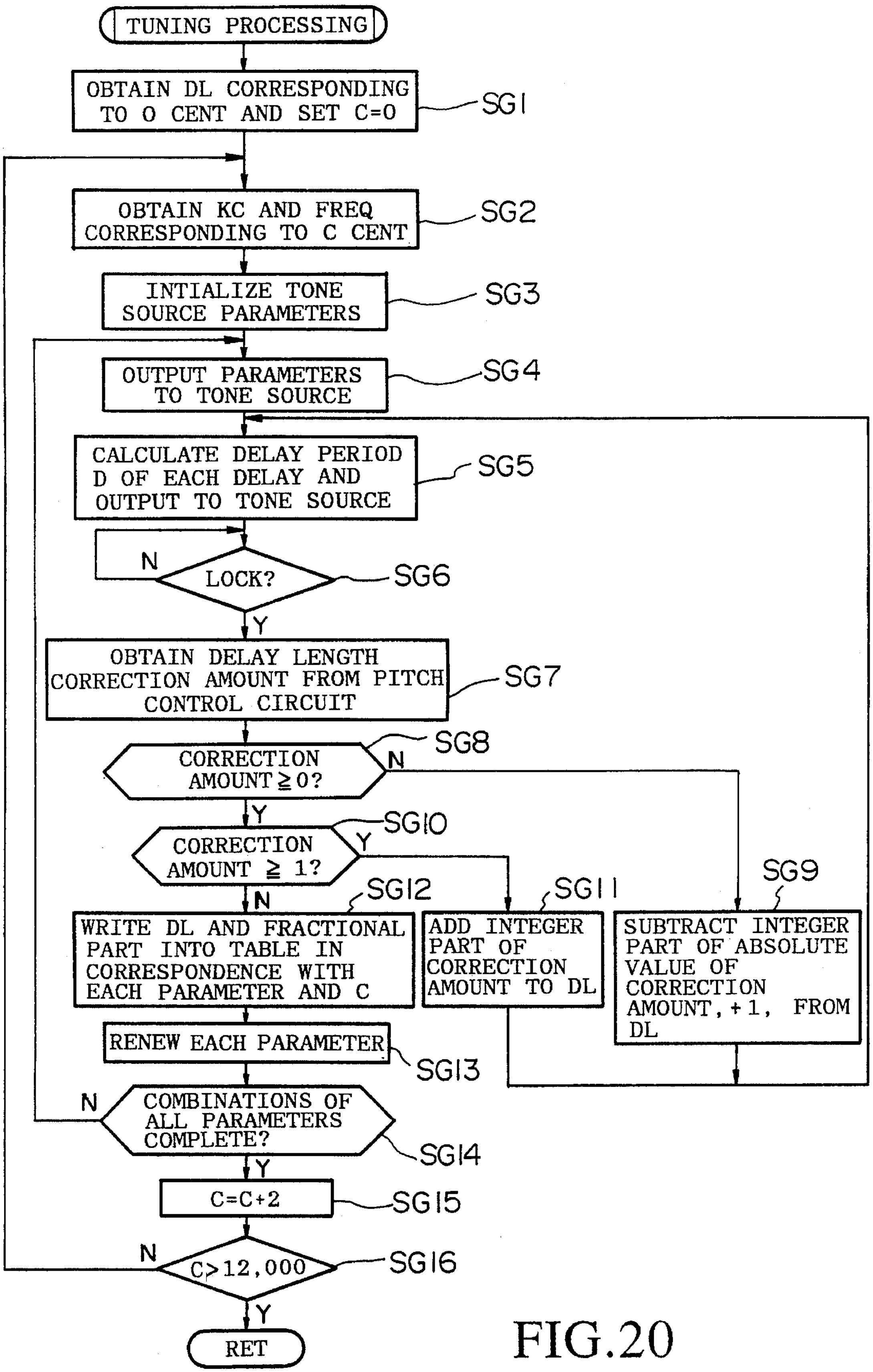
FIG. 20 is a flowchart for the purposes of explaining the operation of the tuning processing of a fourth preferred embodiment.

Next, the operation of the above structure will be explained with reference to the above FIG. 15, FIG. 16 and FIG. 18, and with reference to the flowcharts shown in FIG. 20 and FIG. 21. When the power is turned on, CPU3 executes the main routine shown in FIG. 15. First, in step SA1, all registers, variables and the like are initialized. Next,in step SB2, the panel processing shown in FIG. 16 is conducted. In this panel processing, the alteration or cancellation of the master tuning, as well as tuning processing, are conducted in accordance with the operation of the control panel. The panel processing shown in FIG. 16 is identical to that of the third preferred embodiment, so that an explanation thereof will be omitted here.

First, in step SC1, the various keys of control panel 2 are scanned, and next, in step SC2, a determination is made as to whether a panel event occurred, that is to say, a determination is made as to whether there was some type of operation. Here, in the case in which the control panel was not operated, the routine is ended at this point, and the main routine shown in FIG. 15 is returned to.

On the other hand, in the case in which there was a panel event at a TUNE key, step SC5 is proceeded to, and a determination is made as whether the "+" and "–" keys were simultaneously pressed. In the case in which the "+" and "–" keys were pressed simultaneously with a TUNE key, the register TUNE, which is described hereinafter, is cancelled, and then the main routine of FIG. 15 is returned to.

Furthermore, in step SC5, in a case in which the "+" and "–" keys were not simultaneously pressed, a determination is made as to whether a "+" key was pressed along with the TUNE key. Here, in the case in which a "+" key was pressed simultaneously with a TUNE key 54, in step SC8, a value of "1" is added to register TUNE, and then the main routine of FIG. 15 is returned to. Furthermore, in the case in which a "+" key was not pressed with the TUNE key, in step SC9, a determination is made as to whether a "–" key was pressed or not, and in the case in which a "–" key was pressed together with TUNE key, step SC10 is proceeded to. In step SC10, a value of "1" is subtracted from register TUNE, and then the main routine of FIG. 15 is returned to.

On the other hand, in the case in which the determination result of step SC9 is "NO", step SC11 is proceeded to, and a determination is made as whether a "0" key was pressed or not, and in the case in which the "0" key was not pressed simultaneously with the TUNE key, the main routine of FIG. 15 is returned to at this point. Furthermore, in step SC11, in the case in which a "0" key was simultaneously pressed with the TUNE key 54, step SC12 is proceeded to, and the tuning processing shown in FIG. 20 is executed. Next, the tuning processing in accordance with the flow chart shown in FIG. 21 will be explained.

First, in step SG1, a delay value DL corresponding to zero cents is set manually or by means of fixed calculations. Furthermore, register C is a register which indicates the cent value of the time of the conducting of tuning; in order to establish a range of from zero cents to 12000 cents, this is cleared to an initial value of "0". Then, step SG2 is proceeded to, and a frequency FREQ and key code KC corresponding to the cent value of register C are obtained. Here, the reason that a key code KC is necessary is as follows. When each parameter is stored by key code KC, a large amount of memory area is necessary, and in addition it is difficult to insure pitch accuracy. In the present preferred embodiment, in order to save memory area, the value of each parameter is set to a value identical to that at the time of normal musical tone synthesis, and in order to insure the pitch accuracy, the above parameters are subjected to key scaling in accordance with key codes KC. Among key scaling methods, there is a method by means of calculation and a method by means of reference to a table; however, the method by means of calculation is common. Next, step SG3 is proceeded to, and in order to obtain the pitch tables for each parameter corresponding to the various output pitches, the initialization of the tone source parameters (the non-linear function forms, and the like) is conducted. Next, step SG4 is proceeded to, and the above tone source parameters are outputted to musical tone synthesis circuit 53.

In the following steps SG5–SG11, the establishment of a delay length DL and a correction amount dd for each cent value (in the present embodiment, for each two cents) is conducted. In step SG5, the delay stages D1, D2, . . . DN–1, DN (integer) of the delay circuits 58, 58,58, . . . 58 and 59 shown in FIG. 12 are calculated from the delay length DL (in the case of the present example, the total delay amount), and are outputted to the delay circuits. The stage numbers of delay circuits 58, 58, . . . 58 are determined by the shape of the instrument body which is to be simulated and the number of divisions in the body which is to be simulated. Here, only the final delay circuit 59 has a circuit structure which is capable of realizing a delay corresponding to a coefficient having a fractional value, so that the delay stage number DN corresponding to the circuit is corrected by means of the correction amount dd obtained by means of the pitch adjustment, which will be described hereinafter,and is then sent to the delay circuit. Next, step SG6 is proceeded to, and a determination is made as to whether the frequency (pitch) of the waveform signal WS which is outputted by the musical tone synthesis circuit 53 is locked to the frequency of the oscillation signal OF or not. This determination is conducted by means of the END signal which is outputted by pitch control circuit 6. The determination result of this step SG6 remains "NO" until the frequency of waveform signal WS is locked to the frequency of oscillation signal OF and pitch control circuit 52 outputs an END signal. Accordingly, until the results of the determination of step SG6 are "YES", this step is repeatedly executed. Then, when the frequency of waveform signal WS is locked to the frequency of oscillation signal OF, and the determination results of the above step SG6 becomes "YES", step SG7 is proceeded to In step SG7, the correction amount dd of the delay value outputted by pitch control circuit 52 is incorporated. Next, step SG8 is proceeded to, and a determination is made as to whether the correction amount dd is greater than "0" or not. Here, with the delay having fractional interpolation shown in FIG. 14, it is of course necessary that integer value I and fractional value F be positive numbers, so that case division is conducted in accordance with the correction amount. In the case in which this correction amount is smaller than "0", the results of the determination of step SG8 become "NO", and step SG9 is proceeded to. In step SG9, a value consisting of the integer part I of the absolute value of the correction amount dd, plus a value of 1, is subtracted from delay value DL. For example, if the correction amount dd has a value of (–3.4), a value of "4" will be subtracted from delay value DL. By means of this subtraction, when the following lock operation is conducted, it is to be expected that a correction amount consisting of only a positive fractional value will be obtained. Then, step SG5 is returned to, and based on the delay value DL from which the integer part of the absolute value of the correction amount dd has been subtracted, the delay periods D1, D2, . . . , DN–1 and DN of the delay circuits 58, 58, . . . , 58 and 59 are calculated. After this, in the same way as in the above processing, a new waveform signal WS is created by means of musical tone synthesis signal 53 in steps SG6–SG7.

On the other hand, in step SG8, in the case in which correction amount dd is smaller than "0", the results of the determination in the step SG8 become "YES", and step SG10 is proceeded to. In step SG10, a determination is made as to whether the correction amount dd is greater than "1" or not. Then, in the case in which the result of the determination of step SG10 is "YES", the incorporation of the integer part into the delay value DL is indicated, so step SG11 is proceeded to. In step SG11, the integer part I of the correction amount of dd is added to the delay value DL. Then, step SG5 is returned to, and based on the delay value DL which is the calculation result, the delay periods D1, D2, . . . DN–1 and DN of the delay circuits 58, 58, . . . , 58 and 59 are calculated. After this, in the same way as in the above processing, in step SG5–SG7, a new waveform signal WS is created in accordance with the correction amount dd by means of musical tone synthesis circuit 53. Then, in step SG10, again, a determination is conducted as to whether the value of the correction amount dd is greater than "1" or not. In the case in which the correction value dd is greater than "1", step SG11 is proceeded to in order to incorporate the integer part of correction amount dd into delay value DL, and after a new delay value DL is obtained, steps SG5–SG7 are repeatedly executed.

On the other hand, if the correction amount dd is smaller than "1", and the results of the determination of step SG10 are "NO", step SG12 is proceeded to. At this point, the value of correction amount dd has been determined to be within a range of 1>dd>or=0 by means of the determinations of step SG8 and SG10.However, it is possible that the value of correction amount dd does not become less than 1 as a result of the shape of the instrument body which is to be simulated or the behavior of the nonlinear pattern. It is not likely that such a situation would occur frequently; however in order to counteract this, it is acceptable to set the determination standard for correction amount dd to a value greater than "2" in step SG10. Furthermore, it is also possible to compulsorily determine the value of correction amount dd after a certain number of cycles (for example three cycles) have passed, so as to avoid a infinite loop.

Next, in step SG 12, the delay value DL and the fractional part F of correction amount dd are written into a table in accordance with the cent value of register C. In the case of this example, only the fractional part F of the correction amount dd is written, so that this contributes to the reduction of data. Next, step SG13 is proceeded to, and the tone source parameters are updated. Then, in step SG14, a determination is made as to whether all combinations of the tone source parameters have been completed or not. In the case in which the results of this determination of step SG14 are "NO", step SG4 is returned to, and steps SG4–SG13 are executed in the same manner as above, a new correction amount dd corresponding to the new tone source parameters is calculated, and the fractional part thereof is written into the table.

On the other hand, when the combination of all tone source parameters have been finished, the results of the determination of step SG14 become "YES", and step SG15 is proceeded to. In step SG15, a value of "2" is added to register C, and the next cent value is proceeded to. Next, step SG16 is proceeded to, and in this step SG16, a determination is made as to whether the value of register C has exceeded "12,000" or not. This is done in order to determine whether or not a correction value has been found for all cent values from 0 cents to 12,000 cents (a ten octave range). Next, in the case in which the results of the determination of step SG16 are "NO", step SG2 is returned to, and in order to calculate a correction value dd corresponding to the next cent value, steps SG2–SG15 are repeatedly executed.

On the other hand, when the value of register C exceeds "12000", the results of the determination of step SG16 become "YES", and the panel processing of FIG. 16 is returned to, and then, the main routine of FIG. 15 is returned to.

In this manner, when the panel processing in step SB2 of the main routine is completed, step SB3 is proceeded to. In step SB3, the control element processing shown in FIG. 18 is conducted.

This control element processing is identical to that of the above third preferred embodiment; in step SC1, CPU3 scans the pitch bend wheel as a control element, and then step SC2 is proceeded to, and based on the results of the above scan, a determination is made as to whether an event occurred at a control element. Here, in the case in which there was an event at a control element, step SC3 is proceeded to, and pitch bend data which is converted into cent unit data are stored in register BEND in accordance with the present state of the control elements.

Then, in the case in which the above step SC3 has been completed, or there was no event at the pitch bend wheel, the main routine of FIG. 15 is returned to, and step SB4 is proceeded to.

Figure 21:
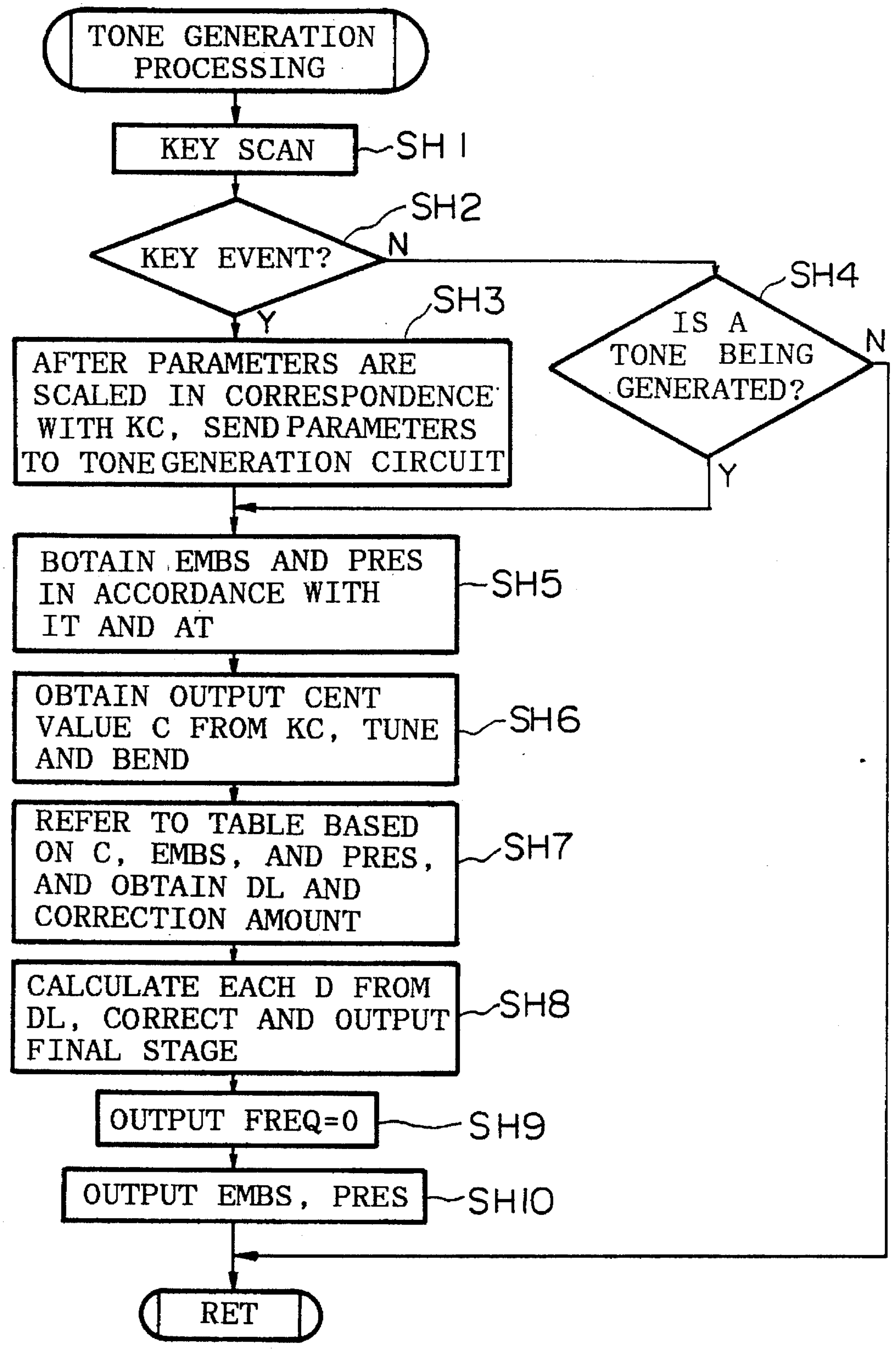
FIG. 21 is a flowchart for the purposes of explaining the tone processing in the same fourth preferred embodiment.

In step SB4, the tone generating processing shown in FIG. 21 is conducted. First, in step SH1, the keys of keyboard 1 are scanned. Next, in step SH2, a determination is made as to whether a key event was generated or not. Here, when a key event (a pressing of a key) exists, the results of the determination in step SH2 become "YES" and step SH3 is proceeded to. In step SH3, all parameters are subjected to scaling in accordance with a key code KC, and then these are outputted to musical tone synthesis circuit 53.

On the other hand, in a case in which the results of the determination of step SH2 are "NO", in other words, in the case in which there was no key event, step SH4 is proceeded to. In step SH4, a determination is made as to whether a musical tone is currently being generated or not. Then, in the case in which the results of the determination of step SH4 are "NO", the routine is ended at this point, and the main routine is returned to. On the other hand, in the case in which the results of the determination of step SH4 are "YES", various types of modulation can be added by means of control elements such as the pitch bend wheel and the like, so that step SH5 is proceeded to. Furthermore, in the case in which the above step SH3 is completed, as well, step SH5 is proceeded to.

In step SH5, data relating to the embouchure EMBS and the playing pressure signal PRES are obtained in accordance with the initial touch IT and after touch AT. As pitch can change in accordance with the above data as well with the tone source of the present preferred embodiment, in this processing, these values are referred to, and a delay length table is consulted. Next, step SH6 is proceeded to, and cent values are obtained in accordance with a key code KC, a melody TUNE and a bend BEND. Melody TUNE and bend BEND are sent in cent values, so that the key code KC is converted into a cent value by means of reference to a table or by means of calculation, and by means of adding all these values, a cent value C is obtained. Next, step SH7 is proceeded to, and based on the above sent value C, embouchure EMBS, and playing pressure signal PRES, a table is referred to, and a delay length DL and correction amount dd (fractional part F), which were written by the above tuning processing, are read out. Next, in step SH8, delay stage numbers D1, D2, . . . , DN−1 and the final stage delay stage DN are found based on delay length DL, and the final stage delay period DN is corrected by means of correction amount dd and is outputted to musical tone synthesis circuit 53. Next, step SH9 is proceeded to, and in order that pitch adjustment is not conducted by means of feedback at the time of musical tone generation, oscillation signal OF is set to a value of "0" and outputted to pitch control circuit 52. Next, step SH10 is proceeded to. In step SH10, embouchure EMBS and playing pressure signal PRES are outputted to musical tone synthesis circuit 53. Musical tone synthesis circuit 53 generates a waveform signal WS having accurate pitch based on the above embouchure EMBS, playing pressure signal PRES, and delay stage numbers D1, D2, . . . , DN−1 and DN. Then, this waveform signal WS is generated as a musical tone in sound system 8 and a speaker. Next, step SB2 of the main routine is returned to, panel processing is conducted, and then, as in the case of the above processing, control element processing is conducted in step SB3, and then tone generation processing is conducted in step SB4. Next, step SB2 is returned to, and the loop consisting of steps SB2–SB4 is repeatedly executed.

(Fifth Preferred Embodiment)

Next, a fifth preferred embodiment, which is a modification of the third preferred embodiment, will be explained.

(Structure of the Fifth Preferred Embodiment)

The structure of the fifth preferred embodiment is identical to the structure of the third preferred embodiment shown in FIG. 8 above. Here, only the points of difference in the present preferred embodiment will be explained. In the present preferred embodiment, as in the case of the fourth preferred embodiment, at the time of tuning, delay amounts corresponding to various combinations of embouchures EMBS and playing pressure signals PRES are determined in advance as parameters, and these are stored in RAM5 in table form, and the structure of the pitch control circuit 52 is changed, and the output of the correction amount dd of the delay amount at the time of tuning and the time of tune generation is synchronized with a fixed cycle, which will be described hereinafter, and outputted.

Figure 22:
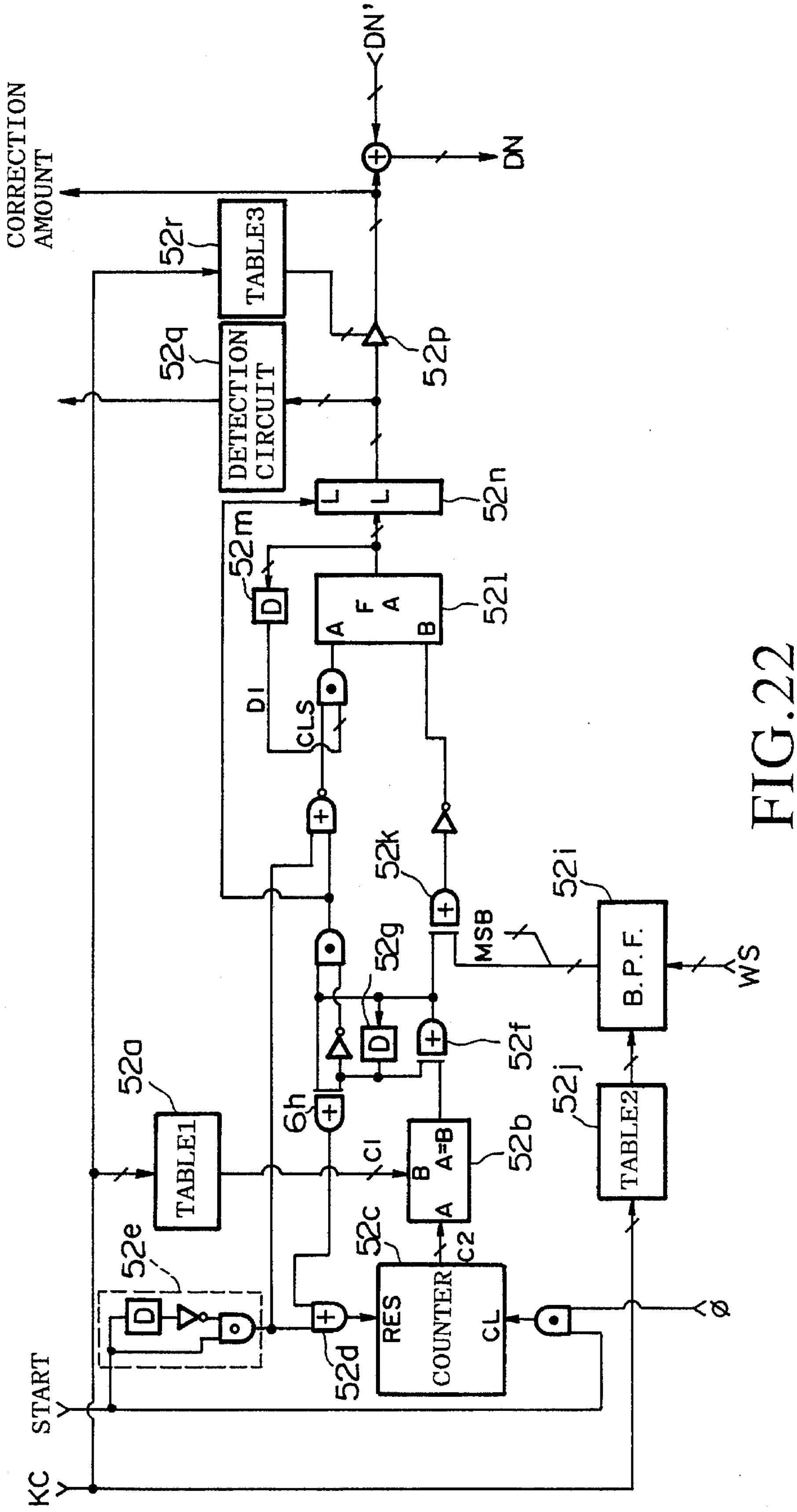
FIG. 22 is a circuit diagram showing the structure of a pitch control circuit 52 in a fifth preferred embodiment.

A key code KC is supplied from CPU3 to the above pitch control circuit 52, and this key code KC is converted into a fixed count value C1 by means of the table TABLE 52*a* shown in FIG. 22. The count value C1 is a cycle number corresponding to a half cycle area of a musical tone in accordance with key code KC. Furthermore, musical tone synthesis, carried out by means of the delay feedback of musical tone synthesis circuit 53, which is described hereinafter, and the output cycle of the above count value C1 are conducted based on the same clock ϕ. This count value C1 is supplied to the input terminal B of comparer 52*b*.

Counter 52*c* is connected to input terminal A of comparer 52*b*, and counter 52*c* conducts counting based on the above clock ϕ. CPU3 supplies a start signal START, and this start signal START has a value of "1" when the adjustment of musical tone pitch is conducted by means of feedback, and has a value of "0" in other situations. When the value of the start signal START is "0", clock is ϕ not supplied to counter 52*c*, and the operation of circuits which will be described hereinafter is stopped. In contrast, when the value of start signal START is "1", counter 52*c* conducts counting based on clock ϕ, as stated above. Here, at the time at which the value of start signal START is set to "1" and the pitch control circuit 52 is set into operation, the value of the counter 52*c* is unstable, so that a case of incorrect operation is produced. Accordingly, in order to avoid this type of incorrect operation, an OR circuit 52*d* is connected to the reset terminal of counter 52*c*. A start signal START starting detection circuit 52*e*, comprising a NOT circuit, a delay circuit and an AND circuit, is connected to one input terminal of OR circuit 52*d*. By means of starting detection circuit 52*e*, when the value of start signal START is changed from "0" to "1", the count value C2 of counter 52*c* is reset.

Comparer 52*b* compares count value C1, which is supplied from the above mentioned table TABLE 52*a*, and count value C2, which is supplied from counter 52*c*, and in the case in which C1=C2, a value of "1" is outputted from output terminal A=B. A loop consisting of an EOR (exclusive OR) circuit 52*f*, which is connected to the later stages of comparer 52*b*, and a delay circuit 52*g*, functions as an on/off switch. That is, when the signal of the output terminal A=B is outputted, an output stage of "0" or "1" is repeated.

Furthermore, the output of delay circuit 52*g* is supplied to the reset terminal of counter 52*c* through the media of EOR circuit 52*h* and OR circuit 52*d*. This is used as a signal for the purpose of again resetting to "0" the value of the counter 52*c*, which has conducted counting until a situation was reached in which C1=C2. Properly, this is used as a reset signal which finds the exclusive OR of the sample which is one previous to the output of EOR circuit 52*f* (corresponding to the output of delay circuit 52*g*) and the present output (the output of EOR 52*f*).

Proceeding in the above manner, "1" and "0" are repeatedly outputted for a period corresponding to key code KC (count value C1). As "1" and "0" form one cycle, it is necessary that the count numbers C1 which are stored in table TABLE 52*a* represent one half of a cycle corresponding to a key code KC.

Next, waveform signal WS is first supplied to band pass filter 52*i*, key code KC data is supplied to this band pass filter 52*i* through the medium of table TABLE 52*j*, and only a basic pitch is extracted from waveform signal WS. Filter coefficients of the band pass filter 52*i* corresponding to frequencies of key codes KC are stored in the above table TABLE 52*j*.

The musical tone signal WS, which is passed through the band pass filter 52*i*, has a form which is close to that of a sine wave. Here, in order to make calculation in bit units easier, only the most significant bit MSB, which places the output of band pass filter 52*i* into a rectangular waveform, is extracted, that is to say, only an encoding bit is extracted, and the other bits are dumped.

In EOR circuit 52*k*, the exclusive OR of the most significant bit MSB and the output of the EOR circuit 52*f* which is connected to the final stage of comparer 52*b*, is obtained. This corresponds to the phase comparison called PLL. That is to say, by means of obtaining the exclusive OR, the output of the EOR circuit 52*k* has a value of "1" at places at which there are phase differences (in the rectangular wave). Furthermore, by means of the inversion of the output by means of a NOT circuit, the output has a value of "1" at points of phase agreement.

In the next loop, which is formed by full adder 52L and delay circuit 52*m*, the output of the above NOT circuit is accumulated. An AND circuit is connected to one input terminal A of full adder 52L, and data D1, which are used for accumulation, are supplied to one input terminal of this AND circuit, and a clear signal CLS for the purpose of clearing accumulated data is supplied to the other input terminal. The clear signal CLS is a NOR output resulting from the processing of the starting pulse of the above start signal START, and the signal of the output terminal A=B of comparer 52*b*. That is to say, full adder 52L is reset when start signal START starts or when the value of the output terminal A=B of comparer 52*b* changes from "0" to "1", for the same reason that counter 52*c* is reset. That is, full adder 52L is synchronized with one cycle of the rectangular wave synthesized by means of key code KC and is reset. This signal is simultaneously supplied to latch circuit 52*n* and the incorporation timing thereof is controlled. By means of this, phase displacement data which are synchronized with one cycle of the musical tone can be obtained.

In the next multiplier 52*p*, the phase displacement data which were obtained by means of the above method are subjected to scaling by means of the key code data obtained through the medium of table TABLE 52*r*; these are used as delay length correction data, are added to a delay length DN containing some error, and an accurate delay length DN is obtained.

The detection circuit 52*q* detects the entry of the output from latch circuit 52*n* into a fixed range which is close to a maximum value, and outputs a LOCK signal (corresponding to the END signal of the third and fourth preferred embodiments) indicating that the pitch is stable to CPU3.

(Operation of the Preferred Embodiment)

Figure 23:
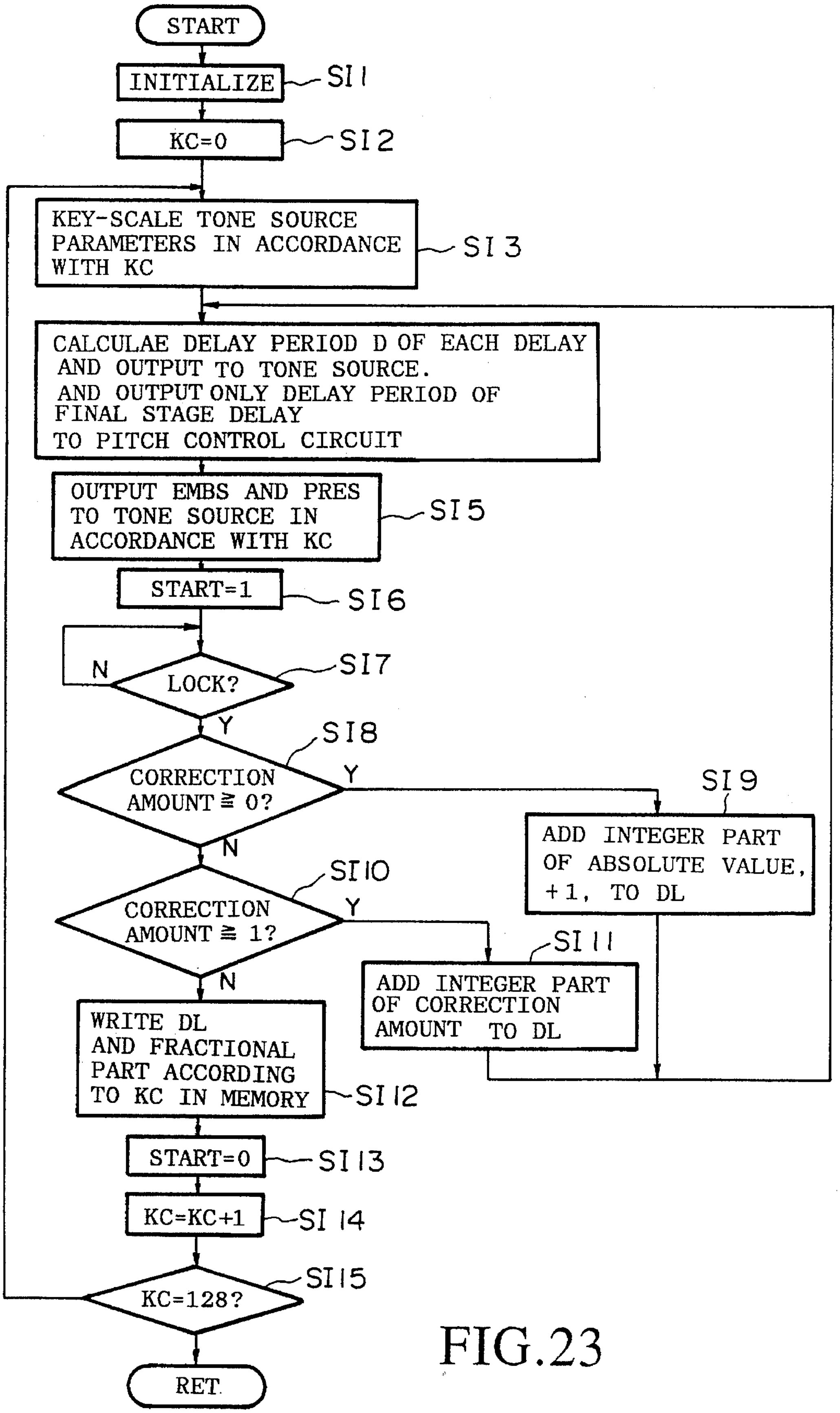
FIG. 23 is a flowchart for the purposes of explaining the operation of the tuning processing in the same fifth preferred embodiment.

Next, the operation of the above-described structure will be explained with reference to FIG. 23. When the power is turned on, CPU3 executes the main routine shown in FIG. 15 and the panel processing shown in FIG. 16. This processing is identical to that of the third and fourth preferred embodiments, so an explanation thereof will be omitted here. Next, in the step SC11 of the panel processing shown in FIG. 16, in the case in which the "0" key was pressed simultaneously with a TUNE key 54, step SC12 is proceeded to, and the tuning processing shown in FIG. 23 is executed. Next, tuning processing in accordance with the flowchart shown in FIG. 23 will be explained.

First, in step SI1, the initialization of all registers, variables and the like is conducted. Next, step SI2 is proceeded to, and the value of a key code KC is set to "0". In step SI3, the tone source parameters (for example, filter coefficients, non-linear type forms) are subjected to scaling in accordance with this key code KC. Next, in step SI4, the delay stage numbers D1, D2, . . . , DN–1, DN (integer) of the delay circuits 58, 58, . . . , 58 and 59 shown in FIG. 12 are calculated from delay length DL (in the case of this example, the total delay amount), and these are outputted to the various delay circuits. The stage numbers of the delay circuits 58, 58, . . . 58 are determined by means of the shape of the instrument body which is to be simulated and the number of divisions in the instrument body which is to be simulated. Here, only the final stage delay circuit 59 has a circuit structure which is capable of realizing delays corresponding to fractional coefficients, so that the delay stage number DN corresponding to this circuit is first corrected by means of a correction amount dd obtained by means of pitch adjustment which will be explained hereinafter, and is then sent. Next, in step SI5, embouchure EMBS and playing pressure signal PRES corresponding to key code KC are supplied to musical tone synthesis circuit 53. In the present invention, various types of musical tone data are supplied to musical tone synthesis circuit 53 in this manner, and a musical tone is actually generated. Generally, the output of sound system 8 is controlled so that a musical tone cannot be outputted to the outside. Next, in step SI6, the value of start signal START is set to "1", so that the operation of pitch control circuit 52 will begin. At this point, the LOCK operation by means of feedback begins. Next, step SI7 is proceeded to, and a determination is made as to whether the frequency (pitch) of the waveform signal WS out putted by musical tone synthesis circuit 53 is locked (in agreement with) to the frequency indicated by means of key code KC. This determination is carried out by means of the LOCK signal which is outputted by pitch control circuit 52. The results of the determination of step SI7 remain "NO" until the frequency of waveform signal WS is locked and pitch control circuit 52 outputs a LOCK signal. Accordingly, this is repeatedly executed until the results of the determination of step SI7 become "YES". Next, when the frequency of waveform signal WS is locked, the results of the determination of step SI7 become "YES", and step SI8 is proceeded to. Next, in step SI8, a determination is made as to whether the value of correction amount dd is greater than "0" or not. Here, in the delay having fractional interpolation attached thereto shown in FIG. 14, it is of course necessary that integer part I and fractional part F have positive values, so that case division is carried out in accordance with the correction amount. Then, in the case in which the correction amount is greater than "0", the results of the determination of step SI8 become "YES", and step SI9 is proceeded to. In step SI9, the integer part I of the absolute value of the correction amount dd, plus 1, is added to delay length DL. In this manner, the correction of delay length DL is conducted in accordance with correction amount dd. Next, step SI4 is returned to, and based on the delay value DL, from which correction amount dd has been subtracted, delay periods D1, D2, . . . , DN–1 and DN of delay circuits 58, 58, . . . 58 and 59 are calculated. After this, in the same way as in the above processing, a new waveform signal WS is generated by means of musical tone synthesis circuit 53 in steps SI5 and SI6.

On the other hand, when the value of correction amount dd becomes smaller than "0", in step SI8, the results of the determination become "NO" and step SI10 is proceeded to. In step SI10, a determination is made as to whether the correction value dd is greater than "1" or not. In the case in which the results of the determination of step SI10 are "YES", the incorporation of the integer part I into the delay length DL is indicated, so that step SI11 is proceeded to. In step SI11, the integer part I of correction amount dd is added to delay length DL. Next, step SI4 is returned to, and based on the delay length DL which is the result of the calculation, the delay periods D1, D2, . . . , DN–1 and DN of delay circuits 58, 58, . . . , 58 and 59 are calculated. After this, in the same way as in the above processing, a new waveform signal WS is generated by musical tone synthesis circuit 53 in accordance with correction amount dd in steps SIS and SI6. Next, in step SI10, again, a determination is made as to whether the value of correction amount dd is greater than "1" or not. The loop formed by the steps SI4–SI11 is continued until the results of the determination in step SI10 become "NO".

Next, when the value of correction amount dd becomes smaller than "1", the results of the determination of step SI10 become "NO", and step SI12 is proceeded to. At this point, the value of correction value dd has been determined to be in a range of 1>dd>=0 as a result of the determinations of steps SI8 and SI10. However, as a result of the form of the instrument body which is to be simulated, or the behavior of the non-linear pattern, it is possible that the value of correction amount dd will not fall below 1. This type of situation is unlikely to occur frequently; however,in order to counteract this, it is acceptable to set the determination standard for the correction amount dd in step SI10 to a value higher than "2". Furthermore, it is also possible to compulsorily determine the value of correction amount dd after a certain number of cycles (for example, 3 cycles) have passed, so as to avoid the occurrence of an infinite loop.

Next, in step SI13, the value of start signal START is set to "0" in order to stop the operation of pitch control circuit 52. Next, in step SI14, key code KC is incremented, and step SI15 is proceeded to. In step SI15, a determination is made as to whether the value of key code KC has reached a value of "128" or not. That is to say, a determination is made as to whether correction values dd have been found for all key codes KC. Next, in the case in which the results of the determination of step SI15 are "NO", step SI3 is returned to, and in order to calculate a correction value dd corresponding to the next key code KC, steps SI3–SI14 are repeatedly executed.

Next, when the value of key code KC exceeds "128", and the results of the determination of step SI15 become "YES", the tuning processing is terminated, and the fixed main routine is returned to.

It is permissible, in the first preferred embodiment, to supply the delay length D1 stored in RAM 5 directly to the delay circuit of musical tone synthesis circuit 7.

Furthermore, in the above-mentioned first and second preferred embodiments, it is permissible for the user to input the delay length D1, which was stored in advance as an initial value. Furthermore, in the above-mentioned first and third preferred embodiments, immediately after the performer reset the parameters, control was conducted by means of the feedback of waveform signal WS in accordance with the pitch control circuit and musical tone synthesis circuit which were to tune all keys, and operations were not conducted at the time of normal musical tone synthesis; however, it is also permissible to conduct automatic operations at the time of musical tone synthesis as well.

Furthermore, in the above-described first and this preferred embodiments, the parameters which conduct adjustment so as to provide accurate pitch by means of PLL are not limited to delay length; filter coefficients are also acceptable.

Furthermore, in the above-described first through fifth preferred embodiments, a delay feedback type tone source was used; however, in spite of this, it is possible to use this in other musical tone synthesis apparatuses in which it is difficult to determine musical tone pitch.

Furthermore, in the above-described first through fifth preferred embodiments, delay circuits 21, 58 and 59 are not limited to shift registers; rather, other delay mechanisms are also permissible.

Furthermore, in the above-described first through fifth preferred embodiments, the musical tone synthesis circuits 7 and 53 are not limited to structures which simulate woodwind musical instruments; rather, other algorithms (strings which are rubbed or struck) may also be realized.

Furthermore, the above-described first through fifth preferred embodiments are not limited to realization by means of hardware; rather, it is permissible to realize these embodiment by means of software such as microprograms or the like.

Furthermore, the processing of each part of the above-described first through fifth preferred embodiments is not limited to digital processing; rather, realization by means of analog processing is also acceptable.

Furthermore, in the above-described first through fifth preferred embodiments, only monophonic tone generation was explained; however, this is not necessarily so limited, and it is permissible to conduct time-sharing polyphonic tone processing which generates a plurality of tones simultaneously.

Furthermore, in the above-described first through fifth preferred embodiments, it is permissible to take the waveform signal WS from any point of the delay feedback loop.

Furthermore, in the third through fifth preferred embodiments, a pitch bend wheel was used as a control element; however, this is not necessarily so limited, and a breath controller is also permissible.

Furthermore, in the third through fifth preferred embodiments, the modulation of the musical tones is not limited to manually operated control elements; rather, such modulation may be automatically accomplished by means of LFOs (low frequency oscillators), or the like. In this case, as well, by means of the conversion of the output of an LFO into cent values, realization is possible without unnecessary complications in processing.

Furthermore, in the third and fourth preferred embodiments, for example, it is permissible to create a table with a resolution on the level of 10 cents, and to find intermediate values of correction amount dd by means of interpolation. It is possible by means of this to reduce the amount of data.

Furthermore, in the fourth preferred embodiment, delay values DL existed for all cent values; however, it is also possible to, for example, provide delay values DL at each 100 cents, and to obtain intermediate delay values DL by means of correction using correction values. In this case, the values will differ from those of a pattern which is analogous to the form of the instrument body which is being simulated; however, as the range involved is small, the actual effects will be slight.

Furthermore, in the third preferred embodiment, if the delay lengths DL and the fractional parts F of the correction amounts dd stored in the table are read in increments of 50, the realization of a half scale is possible. For example, if the value is +10 cents, it is preferable to read in increments of 50 from a position which is shifted upwards 5 places from the base position, and if the value is −20 cents, it is preferable to start at a position 10 places below.

Furthermore, in the fifth preferred embodiment, delay values DL were provided for all key codes KC; however, it is also permissible to provide delay lengths DL at fixed gaps, and to obtain the intermediate delay values DL by means of correction using correction values. In such a case, the values obtained would differ from those of a pattern analogous to the form of an instrument body which is being simulated; however, as the range involved is small, the actual effects will be slight.

Furthermore, in the above-described fourth and fifth preferred embodiments, it is permissible, in order to reduce the memory amount, to store the delay lengths in a table not by means of storing the actual numerical values, but rather by storing the displacement from logical values obtained from key codes KC.

Furthermore, in the above-described fourth and fifth preferred embodiments, it is permissible to store a delay length corresponding to a minimum tone area of twelve tones in advance as a standard delay amount, and to store the correction amounts of other musical tones as displacements from this delay length calculated as a standard.

Furthermore, in the above-described fourth and fifth preferred embodiments, it is permissible to previously provide some type of delay length in place of the automatic pitch adjustment by means of tuning processing.

Furthermore, in the above-described fourth and fifth preferred embodiments, instead of preparing tables corresponding to cent values, embouchures EMBS and playing pressure signals PRES, it is permissible to provide a table of only one type of data, and to reference this with the addition of offsets in accordance with the data of the above embouchures EMBS or playing pressure signals PRES.

Furthermore, in the above-described first through fifth preferred embodiments, an explanation was given using a delay feedback type tone source; however, this is not necessarily so limited, and it is possible to realize these embodiments by means of other types of tone sources.

What is claimed is:

1. An electronic musical instrument, comprising:

means for designating a tuning mode which determines a correlation between tone designating information having a target pitch of a musical tone to be generated and a musical tone which is actually produced in response to predetermined performance data corresponding to the tone designating information, wherein the predetermined performance data includes at least a delay length datum;

means for supplying consecutively the tone designating information and the predetermined performance data when said tuning mode is designated;

musical tone synthesis means, for processing input signals based on at least one parameter and for synthesizing and outputting musical tones with pitches in accordance with the values of said at least one parameter, the musical tone synthesis means including wave transmission means for circulating said input signals along at least two paths, said wave transmission means including a junction between the two paths and means, configured in at least one of said two paths, for extracting said musical tones; and pitch control means for, for when the tuning mode is designated, detecting a difference between the a target pitch of a musical tone to be generated and a pitch of a musical tone outputted by said musical tone synthesis means in response to the predetermined performance data, determining a value of one of said parameters which will eliminate said difference, and storing the determined value for the target pitch, the pitch control means outputting said stored value to said musical tone synthesis means for use during a subsequent musical performance based on actual performance data corresponding to a performance provided during the performance when the tuning mode is not selected.

2. An electronic musical instrument in accordance with claim 1, which further comprises:

memory means for storing initial values of said parameter so as to generate a musical tone having said target pitch, and control means for replacing said initial values in said memory means with new parameter values determined by said pitch control means;

and in which said musical tone synthesis means synthesizes and outputs musical tones with pitches in accordance with said new parameter values stored in said memory means.

3. An electronic musical instrument in accordance with claim 2, wherein parameter values inputted in advance into said memory means as initial values are inputted by means of a fixed input means.

4. An electronic musical apparatus, comprising:

means for designating a tuning mode which determines a correlation between tone designating information having a target pitch of a musical tone to be generated and a musical tone which is actually produced in response to predetermined performance data corresponding to the tone designating information, wherein the predetermined performance data includes at least a delay length datum;

means for supplying consecutively the tone designating information and the predetermined performance data when said tuning mode is designated;

musical tone synthesis means, for processing a plurality of parameters used to synthesize musical tones and for synthesizing and outputting musical tones having pitches corresponding to the plurality of parameters, including wave transmission means for circulating said input signals along at least two paths, said wave transmission means including a junction and means, configured in at least one of said two paths, for extracting said musical tones; and memory means for, when the tuning mode is designated, storing in advance at least one of said plurality of parameters in response to the predetermined performance data in accordance with the state of other of said plurality of parameters, wherein at the time of the musical tone synthesis based on actual performance data corresponding to a performance provided during a performance when the tuning mode is not selected, said at least one parameter stored in said memory means is read out in accordance with said other parameters and is supplied to said musical tone synthesis means.

5. An electronic musical instrument, comprising:

means for designating a tuning mode which determines a correlation between tone designating information having a target pitch of a musical tone to be generated and a musical tone which is actually produced in response to predetermined performance data corresponding to the tone designating information, wherein the predetermined performance data includes at least a delay length datum;

means for supplying consecutively the tone designating information and the predetermined performance data when said tuning mode is designated;

musical tone synthesis means, for processing a plurality of parameters used to synthesize musical tones and for synthesizing and outputting musical tones having pitches corresponding to the plurality of parameters, including wave transmission means for circulating said input signals along at least two paths, said wave transmission means including a junction between said two paths, and means for extracting said musical tones configured in at least one of said two paths; and memory means for, when the tuning mode is designated, storing in advance at least one of said parameters for the synthesis of musical tones having said predetermined pitches in response to the predetermined performance data, wherein, at the time of musical tone synthesis based on said actual performance data corresponding to a performance during a performance when said tuning mode is not selected, said at least one parameter stored in said memory means are read out based on other parameters, and based on said read out parameters and the other parameters, a musical tone signal is formed, and said musical tone signal is synchronized with a fixed cycle signal and then is outputted to said musical tone synthesis means.

6. An electronic musical instrument in accordance with claims 4 or 5, wherein said memory means stores a parameter which determines a corresponding pitch of said musical tone at a selected pitch spacing, and wherein intermediate parameters are calculated by interpolation from the parameters associated with leading and trailing pitch values.

7. An electronic musical instrument in accordance with claims 4 or 5, further comprises a control element for altering said other parameters.

8. An electronic musical instrument in accordance with claim 7, wherein said control element is provided with a breath controller which detects breath pressure of a performer, and outputs a signal in accordance with said breath pressure.

9. An electronic musical instrument in accordance with claim 7, wherein said control element includes LFO (low frequency oscillators), said other parameters are automatically altered by means of said LFO, and in order to simplify calculation processing which obtains cent values from output of said LFO, said control element outputs cent values corresponding to the pitches of said musical tones to be generated.

10. An electronic musical instrument in accordance with claims 4 or 5, wherein said parameters include filter coefficients of filter means provided in said at least two signal paths.

11. An electronic musical instrument in accordance with claim 1, 4 or 5, wherein said musical tone synthesis means conducts fixed processing of said input signals based on at least one parameter.

12. An electronic musical instrument in accordance with claim 11, wherein said wave transmission means further comprises delay means and said parameters designate delay amounts of delay means which delay said input signals circulated in said at least two signal paths.

13. An electronic musical instrument in accordance with claims 1, 4 or 5, wherein said musical tone synthesis means comprises means for implementing algorithms which simulate tone generation mechanisms of a wind musical instrument, a rubbed or struck string musical instrument, or a combination thereof.

14. An electronic musical instrument in accordance with claims 1, 4 or 5, wherein said musical tone synthesis means conducts time-sharing polyphonic tone processing for generating a plurality of tones simultaneously.

15. An electronic musical instrument comprising:

a tuning mode designator designating a tuning mode;

a pitch designator for generating a first information designating a pitch of a musical tone to be generated when the tuning mode is not designated by the tuning mode designator, and for generating second information designating a plurality of target pitches when the tuning mode is designated by the tuning mode generator;

a performance data generator for generating performance data in response to a performance when the tuning mode is not designated, and for generating a predetermined performance data including at least a delay length data when the tuning mode is designated;

a musical tone synthesizer for synthesizing a musical tone signal having a pitch corresponding to a first parameter in response to the performance data generated by the performance data generator; and a pitch controller for generating the first parameter in response to the first information when the tuning mode is not designated, and, when the tuning mode is designated, for generating the first parameter in response to each of the plurality of target pitches, detecting differences between the plurality of target pitches and pitches of musical tone signals, each of which is synthesized by the musical tone synthesizer in response to the predetermined performance data based on the first parameter generated for each of the plurality of target values, and determining values of the first parameter which will eliminate the differences, wherein the determined values of the first parameter are stored so that the pitch controller converts a first information into a first parameter based on the stored determined values during a subsequent musical performance when the tuning mode is not designated.

16. An electronic musical instrument according to claim 15 further comprising:

tone color designator which generates a second parameter designating a tone color of a musical tone signal to be generated, wherein the tuning mode designator designates the tuning mode when the second parameter generated by the tone color designator is changed.

17. An electronic musical instrument according to claim 16, wherein the first parameter is a delay length corresponding to a pitch of a musical tone signal to be generated, and the second parameter is at least one filter coefficient.

18. An electronic musical instrument according to claim 15, wherein the pitch controller has a memory which, when the tuning mode is designated, stores values of the first parameter corresponding to the plurality of target pitches at first and, after the determining, replaces the stored values with the determined values of the first parameter, wherein the pitch controller, when the tuning mode is not designated, reads out a first parameter corresponding to the first information and outputs it to the musical tone synthesizer.

19. An electronic musical instrument according to claim 15, wherein the musical tone synthesizer includes:

a wave transmission means for circulating said input signals along at least two paths wherein the wave transmission means includes:

a junction between the at least two paths; and means for extracting said musical tones, located in at least one of said two paths.

* * * * *